US006410207B1

(12) United States Patent
Nagasaka et al.

(10) Patent No.: US 6,410,207 B1
(45) Date of Patent: Jun. 25, 2002

(54) POSITIVE PHOTOSENSITIVE COMPOSITION, POSITIVE PHOTOSENSITIVE LITHOGRAPHIC PRINTING PLATE AND METHOD FOR MAKING POSITIVE PHOTOSENSITIVE LITHOGRAPHIC PRINTING PLATE

(75) Inventors: Hideki Nagasaka; Akihisa Murata, both of Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/480,161

(22) Filed: Jan. 10, 2000

Related U.S. Application Data

(62) Division of application No. 08/906,258, filed on Aug. 5, 1997, now Pat. No. 6,326,122.

(30) Foreign Application Priority Data

Aug. 6, 1996 (JP) ........................................ 8-207013
Nov. 14, 1996 (JP) ........................................ 8-302722
Jan. 22, 1997 (JP) ........................................ 9-9264

(51) Int. Cl.[7] ........................................ G03F 7/30
(52) U.S. Cl. .................... 430/302; 430/191; 430/192; 430/193; 430/905; 430/926; 430/944
(58) Field of Search .......................... 430/270.1, 191, 430/192, 905, 193, 926, 302, 944

(56) References Cited

U.S. PATENT DOCUMENTS

| | | | | |
|---|---|---|---|---|
| 3,628,953 A | | 12/1971 | Brinckman | 96/36.3 |
| 3,645,733 A | | 2/1972 | Brinckman et al. | 96/36 |
| 4,544,627 A | | 10/1985 | Takahashi et al. | 430/191 |
| 5,227,473 A | | 7/1993 | Kawamura et al. | 430/193 |
| 5,262,278 A | | 11/1993 | Lauke et al. | 430/287.1 |
| 5,340,699 A | | 8/1994 | Haley et al. | 430/302 |
| 5,372,907 A | | 12/1994 | Haley | 430/157 |
| 5,491,046 A | | 2/1996 | Deboer et al. | 430/302 |
| 5,631,119 A | | 5/1997 | Shinozaki | 430/302 |
| 5,786,125 A | | 7/1998 | Tsuchiya et al. | 430/272.1 |
| 5,840,467 A | | 11/1998 | Kitatani et al. | 430/302 |
| 6,060,222 A | * | 5/2000 | West et al. | 430/326 |
| 6,090,532 A | * | 7/2000 | West et al. | 430/326 |
| 6,326,122 B1 | * | 12/2001 | Nagasaka et al. | 430/191 |

FOREIGN PATENT DOCUMENTS

| | | |
|---|---|---|
| DE | 44 26 820 A1 | 2/1995 |
| EP | 0 625 728 A2 | 11/1994 |
| EP | 0 631 189 | 12/1994 |
| EP | 0 652 483 | 5/1995 |
| EP | 0 672 954 A2 | 9/1995 |
| EP | 0 672 954 | 9/1995 |
| EP | 0 833 204 A1 | 4/1998 |
| GB | 2 082 339 | 3/1982 |
| JP | 56-69192 | 6/1981 |
| JP | 7-285275 | 10/1995 |
| JP | 9 43847 | 2/1997 |
| JP | 9-43847 | 2/1997 |
| JP | 9-120157 | 5/1997 |
| WO | WO 96/20429 | 7/1996 |
| WO | WO 97/07986 | 3/1997 |
| WO | WO 97/39894 | 10/1997 |
| WO | WO 98/42507 | 10/1998 |

* cited by examiner

*Primary Examiner*—John S. Chu
(74) *Attorney, Agent, or Firm*—Oblon, Spivak, McClelland, Maier & Neustadt, P.C.

(57) ABSTRACT

A positive photosensitive composition showing a difference in solubility in an alkali developer as between an exposed portion and a non-exposed portion, which comprises, as components inducing the difference in solubility, (a) a photo-thermal conversion material, and (b) a high molecular compound, of which the solubility in an alkali developer is changeable mainly by a change other than a chemical change.

40 Claims, No Drawings

POSITIVE PHOTOSENSITIVE COMPOSITION, POSITIVE PHOTOSENSITIVE LITHOGRAPHIC PRINTING PLATE AND METHOD FOR MAKING POSITIVE PHOTOSENSITIVE LITHOGRAPHIC PRINTING PLATE

This application is a Division of application Ser. No. 08/906,258 filed on Aug. 5, 1997, now U.S. Pat. No. 6,326,122.

The present invention relates to a novel positive photosensitive composition sensitive to a light ray in a wavelength region of from 650 to 1300 nm. More particularly, it relates to a positive photosensitive composition suitable for direct plate making by means of a semiconductor laser or a YAG laser, a positive photosensitive lithographic printing plate employing the composition and a method for making a positive photosensitive lithographic printing plate.

Along with the progress in the image treating technology by computers, an attention has been drawn to a photosensitive or heat sensitive direct plate making system wherein a resist image is formed directly from digital image information by a laser beam or a thermal head without using a silver salt masking film. Especially, it has been strongly desired to realize a high resolution laser photosensitive direct plate making system employing a high power semiconductor laser or YAG laser, from the viewpoint of downsizing, the environmental light during the plate making operation and plate making costs.

On the other hand, as image-forming methods wherein laser photosensitivity or heat sensitivity is utilized, there have heretofore been known a method of forming a color image by means of a sublimable transfer dye and a method of preparing a lithographic printing plate. Known as the latter is, for example., a method of preparing a lithographic printing plate by means of the curing reaction of a diazo compound (e.g. JP-A-52-151024, JP-B-2-51732, JP-A-50-15603, JP-B-3-34051, JP-B-61-21831, JP-B-60-12939 and U.S. Pat. No. 3,664,737), or a method of preparing a lithographic printing plate by means of the decomposition reaction of nitrocellulose (e.g. JP-A-50-102403 and JP-A-50-102401).

In recent years, a technique in which a chemical amplification type photoresist is combined with a long wavelength light ray absorbing dye, has been proposed. For example, JP-A-6-43633 discloses a photosensitive material wherein a certain specific squarilium dye is combined with a photo-acid-generator and a binder.

Further, as a technique of this type, a technique for preparing a lithographic printing plate by exposing a photosensitive layer containing an infrared ray absorbing dye latent Bronsted acid, a resol resin and a novolak resin, in an image pattern by e.g. a semiconductor laser has been proposed (JP-A-7-20629). Further, the same technique wherein a s-triazine compound is used instead of the above latent Bronsted acid, has also been proposed (JP-A-7-271029).

However, these conventional techniques were not necessarily adequate in their performance from a practical viewpoint. As a more serious problem, in the case of such a chemical amplification type photosensitive plate, it was usually essential to have a heat treatment step after exposure, and due to variation of heat treatment conditions or the like, the stability in the quality of the image thereby obtainable was not necessarily adequate, and a technique containing no such a step has been desired. In the above-mentioned JP-A-7-20629 and JP-A-7-271029, a method for obtaining a positive image without requiring the above-mentioned post heat treatment, is proposed, but no specific Examples are given, and no specific method or no fact of obtaining such a positive image is disclosed. Further, in such a technique, the photosensitive material is sensitive also to ultraviolet light, and it is necessary to carry out the operation under yellow light containing no ultraviolet light, such being problematic from the viewpoint of the operation efficiency.

Further, in U.S. Pat. No. 5,491,046, a plate-making method particularly an exposure method, using such a composition is disclosed, but no Example is given for a positive image.

Further, JP-A-60-175046 discloses a radiation sensitive composition comprising an alkali-soluble phenol resin and a radiation sensitive onium salt, which is photo-dissolvable. It is disclosed that in the composition, photo-decomposable decomposition of the onium salt induces the resin to regain the solubility, to satisfy the basic requirement for a photo-dissolvable system, and that the onium salt can be sensitized by an electromagnetic spectrum of a wide range ranging from ultraviolet light to visible light or even to infrared light.

Such an image is formed essentially by a difference in the solubility in a developer as between an exposed portion and a non-exposed portion. For such a difference to be caused, it is common that one of the components in the composition undergoes a chemical change, and to induce such a chemical change, an additive such as a photo-acid-generator, a radical initiator, a crosslinking agent or a sensitizer, is frequently required, whereby there has been a problem that a system will be complicated.

The present invention has been made in view of the above-described various problems.

Namely, it is an object of the present invention to provide a positive photosensitive composition and a positive photosensitive lithographic printing plate, which are simple in their construction, which are suitable for direct recording by e.g. a semiconductor laser or a YAG laser and which have high sensitivity and excellent storage stability.

Another object of the present invention is to provide a novel positive photosensitive material and a positive photosensitive lithographic printing plate, which are highly sensitive to an infrared ray and which require no post exposure heat treatment.

A further object of the present invention is to provide a photosensitive material and a positive photosensitive lithographic printing plate, which do not require an operation under yellow light and whereby the operation can be carried out under usual white light containing ultraviolet light.

A still further object of the present invention is to provide a positive photosensitive lithographic printing plate which is excellent in a burning property as a lithographic printing plate.

Still another object of the present invention is to provide a plate-making method, whereby a positive photosensitive lithographic printing plate can be exposed at high sensitivity.

Such objects of the present invention can be accomplished by the following constructions of the present invention:

A positive photosensitive composition showing a difference in solubility in an alkali developer as between an exposed portion and a non-exposed portion, which comprises, as components inducing the difference in solubility, (a) a photo-thermal conversion material, and (b) a high molecular compound, of which the solubility in an alkali developer is changeable mainly by a change other than a chemical change.

A positive photosensitive composition comprising a photo-thermal conversion material and an alkali-soluble resin and having a characteristic represented by B<A where A is the solubility, in an alkali developer, at an exposed portion of the composition, and B is the alkali solubility after heating of the exposed portion.

A positive photosensitive lithographic printing plate having such a positive photosensitive composition formed on a support.

A method for making a positive photosensitive lithographic printing plate, which comprises a step of scanning and exposing such a positive photosensitive lithographic printing plate by means of a light ray belonging to a wavelength region of from 650 to 1100 nm and having a light intensity sufficient to let the high molecular compound form an image.

Now, the present invention will be described in detail with reference to the preferred embodiments.

Heretofore, as a positive photosensitive composition, a system has been known which comprises an alkali-soluble resin and an o-quinone diazide group-containing compound as a photosensitivity-imparting component. It is believed that with this system, upon irradiation of ultraviolet light which can be absorbed by the o-quinone diazide group-containing compound, the diazo moiety will decompose to finally form carboxylic acid, whereby the alkali-solubility of the resin increases, so that only the exposed portion will dissolve in an alkali developer to form an image. Further, in the composition disclosed in the above-mentioned JP-A-60-175046, the photo-decomposable decomposition of the onium salt contributes to the solubility of the resin. Namely, in these systems, a component in a photosensitive composition undergoes a chemical change.

Surprisingly, the present invention provides a photosensitive composition capable of forming a positive image with a very simple system of a photo-thermal conversion material and an alkali soluble resin where no chemical change is expected.

The reason as to why the photosensitive composition of the present invention provides such an excellent effect is not clearly understood. However, it is considered that the light energy absorbed by the photo-thermal conversion material is converted to heat, and the alkali-soluble resin at the portion subjected to the heat undergoes a change other than a chemical change, such as a change in conformation, whereby the alkali solubility at that portion increases, so that an image can be formed by an alkali developer.

Such an effect is attributable mainly to a change other than a chemical change. This is assumed, for example, from a reversible phenomenon such that when a photosensitive composition of the present invention once irradiated, is heated around 50° C. for 24 hours, the alkali solubility of the exposed portion once increased immediately after the exposure, often returns to a state close to the state prior to the exposure. Thus, the present invention provides a positive photosensitive composition comprising a photo-thermal conversion material and an alkali-soluble resin, which has a characteristic represented by B<A, where A is the solubility, in the alkali developer, at an exposed portion of the composition, and B is the alkali solubility after heating of the exposed portion. Further, the relation between the glass transition temperature (or the softening temperature) of the photosensitive composition itself and the likelihood of the reversible phenomenon, was examined, whereby it was found that the lower the temperature, the more likely the phenomenon. This also supports the above-described mechanism.

Accordingly, it should be understood that the essential constituting components of the positive photosensitive composition of the present invention are a photo-thermal conversion material of component (a) and a high molecular compound of component (b) only, and a material which increases the alkali solubility of an alkali-soluble resin by an action of active radiation, such as the above-mentioned o-quinone diazide group-containing compound, or a material such as a combination of a compound (a photo-acid-generator) which forms an acid by active radiation, with a compound, of which the solubility in a developer increases by an action of the acid, is not substantially required. Further, the positive photosensitive composition of the present invention is used exclusively for forming a positive image, and a material which becomes insoluble in a developer by an action of active radiation, such as a diazo resin, a crosslinking agent and a combination of an ethylenic monomer with a polymerization initiator, which are used as components of a negative photosensitive composition, and a sensitizer for activating them, are also not substantially required. Thus, the composition of the present invention is clearly distinguished also from a photosensitive composition which is useful as both positive and negative photosensitive compositions. Further, the composition of the present invention does not contain a compound susceptible to a-photochemical sensitizing effect by the photo-thermal conversion material and is clearly distinguished from the composition disclosed in JP-A-60-175046.

The positive photosensitive composition of the present invention may contain a solubility-suppressing agent (dissolution inhibitor) which is capable of lowering the alkali solubility of the photosensitive layer prior to exposure, as described hereinafter.

Now, the photo-thermal conversion material (hereinafter referred to as a light-absorbing dye) as the first component used for the positive photosensitive composition of the present invention, will be described. This material is not particularly limited so long as it is a compound capable of converting absorbed light to heat. However, it is preferably a light-absorbing dye (a) having an absorption band covering a part or whole of a wavelength region of from 650 to 1300 nm. The light-absorbing dye to be used in the present invention is a compound which effectively absorbs light in a wavelength region of from 650 to 1300 nm, while it does not substantially absorb, or absorbs but is not substantially sensitive to, light in an ultraviolet region, and which will not modify the photosensitive composition by a weak ultraviolet ray which may be contained in white light. Specific examples of such a light-absorbing dye will be presented in Table 1.

S-1
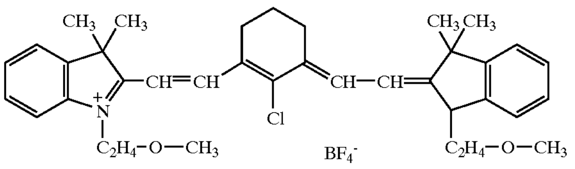
S-2
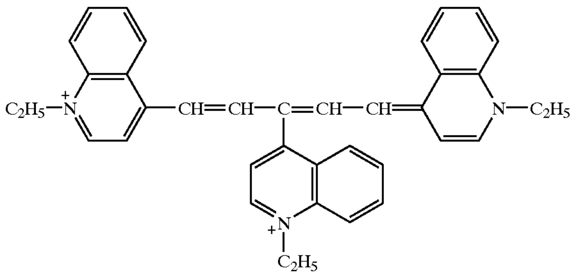
S-3
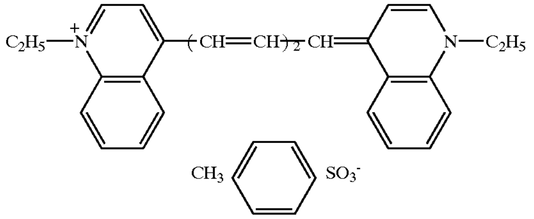
S-4
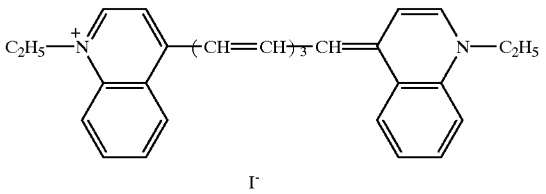
S-5
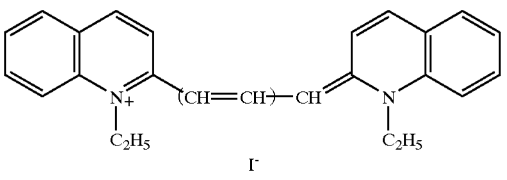
S-6
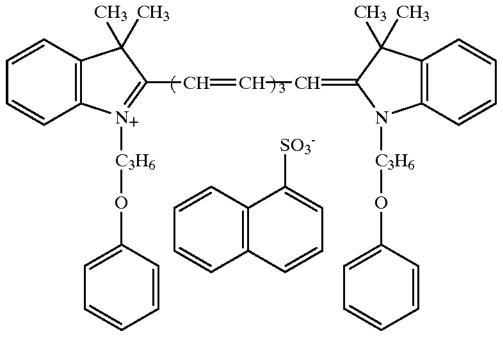
S-7
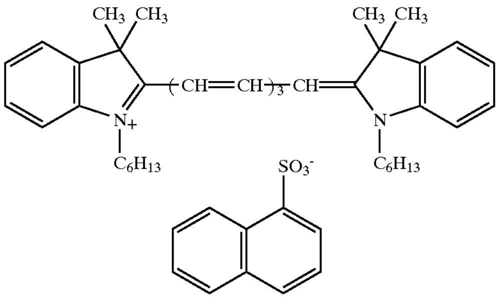
S-8
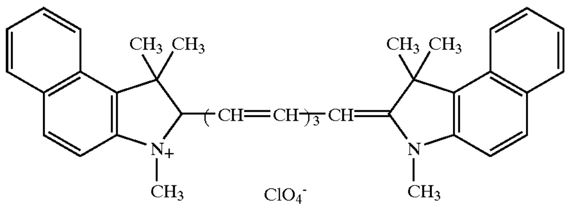
S-9
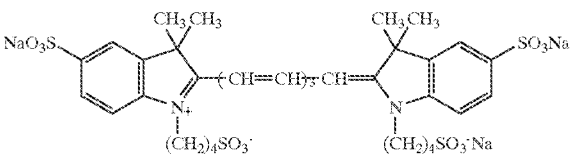
S-10
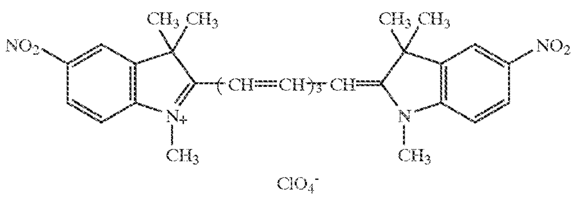

-continued
S-11
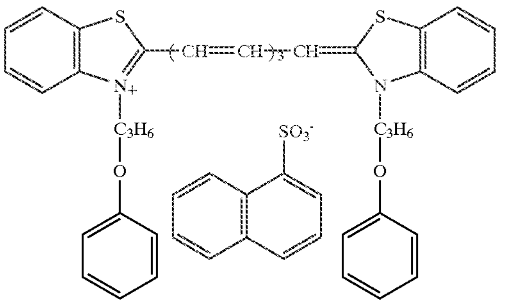
S-12
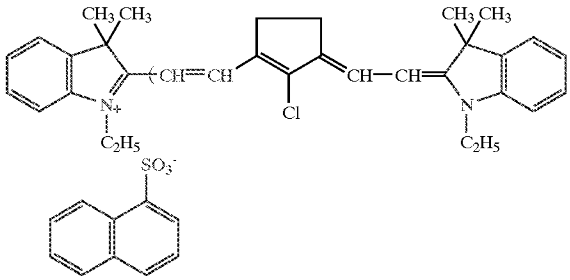
S-13
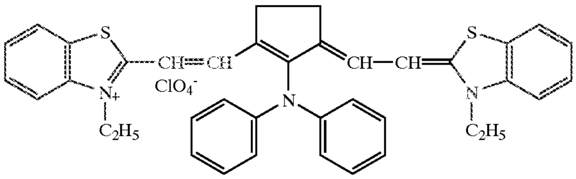
S-14
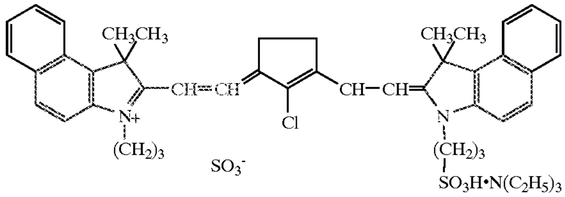
S-15
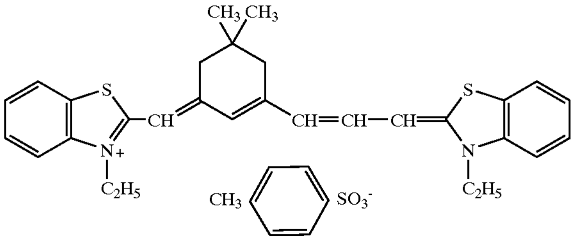
S-16
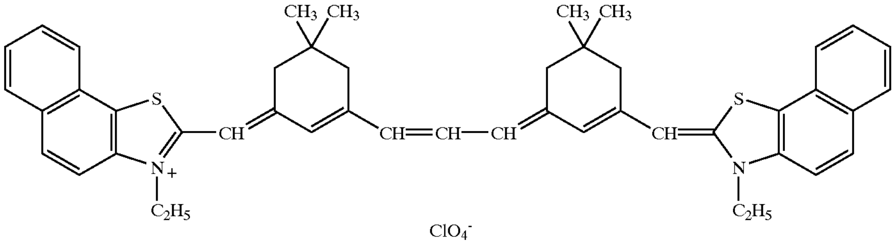
S-17
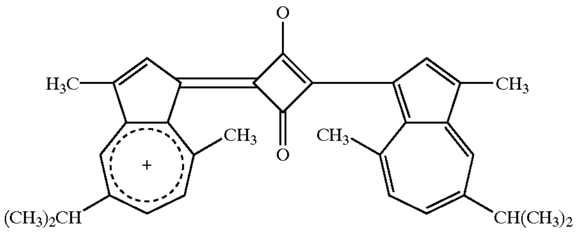
S-18
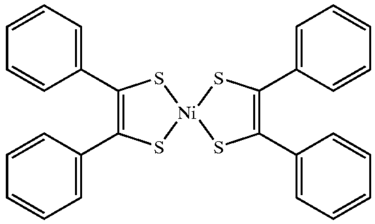
S-19
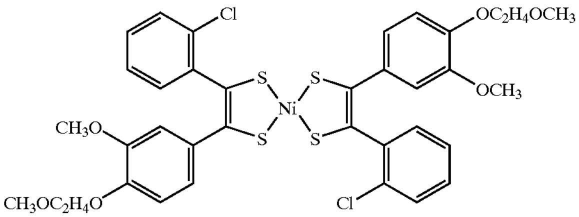
S-20
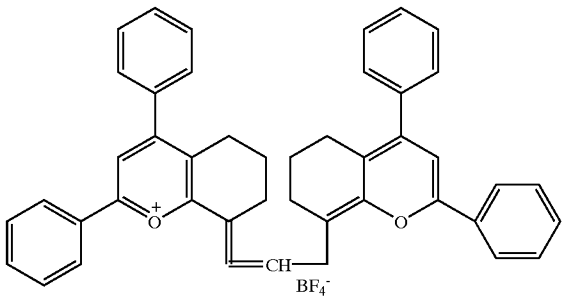

-continued
S-21
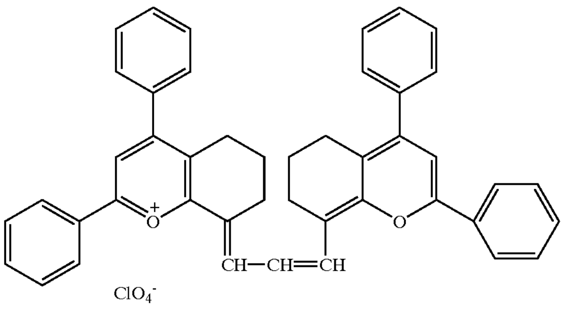
S-22
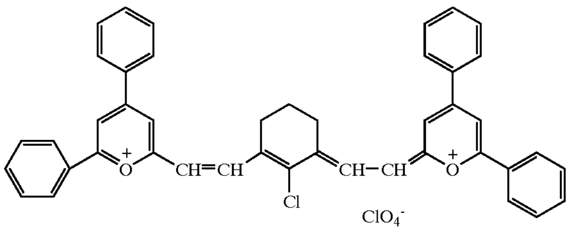
S-23
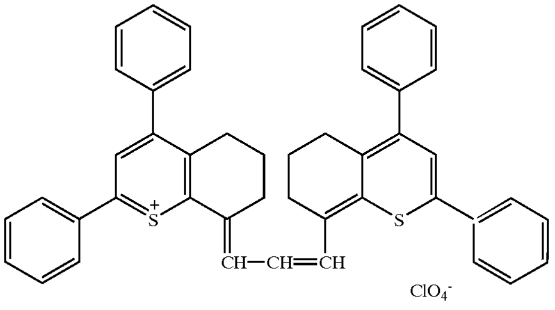
S-24
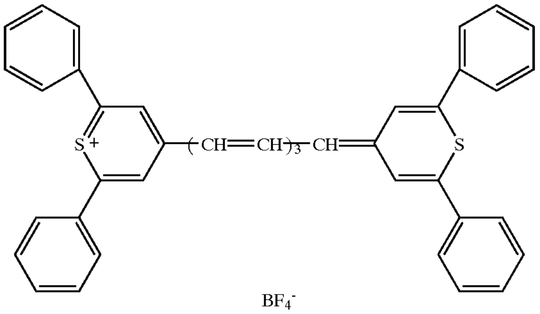
S-25
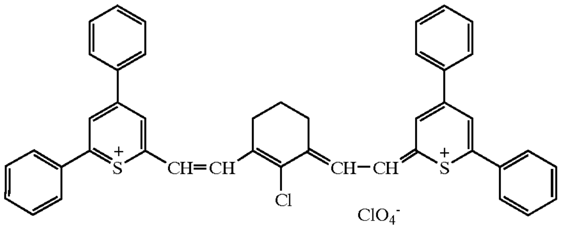
S-26
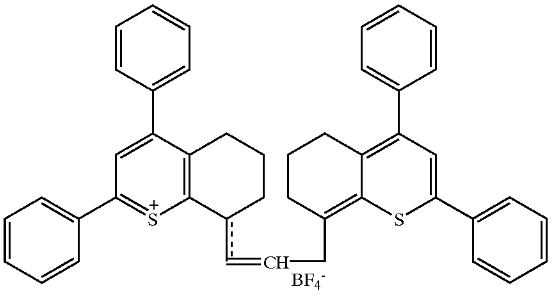
S-27
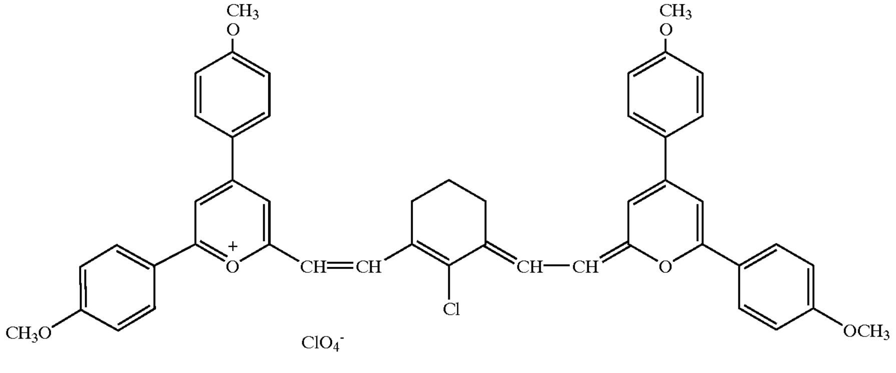

-continued
S-28
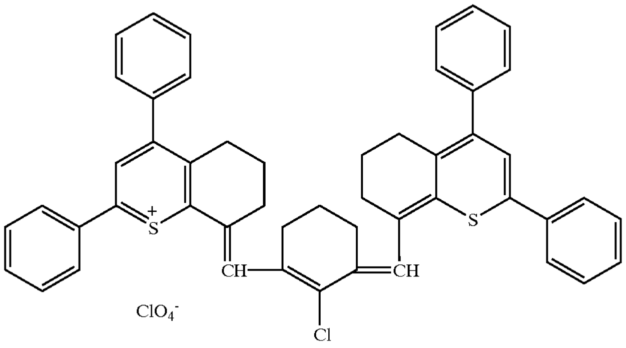
S-29
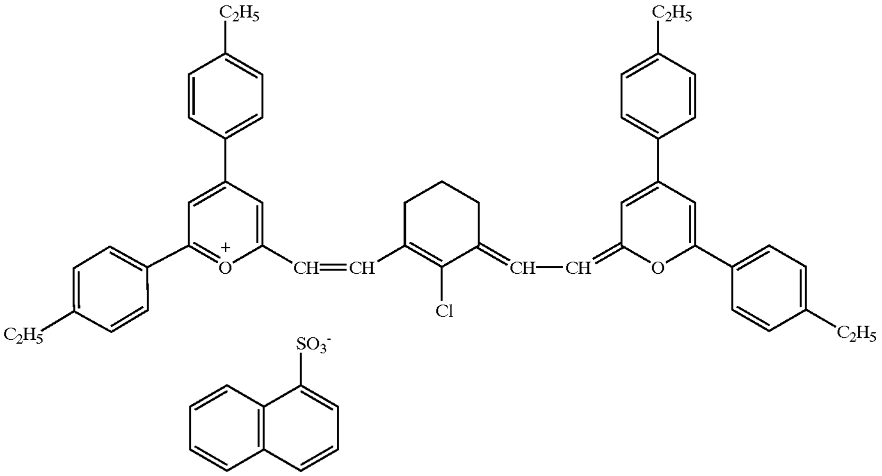
S-30
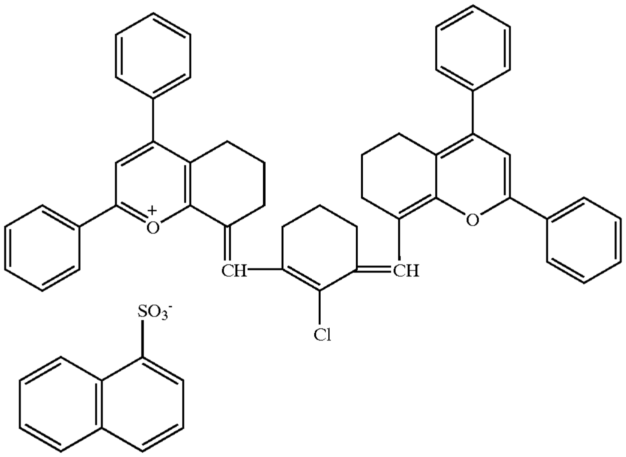
S-31
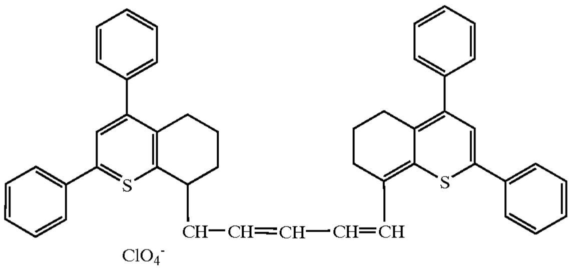
S-32
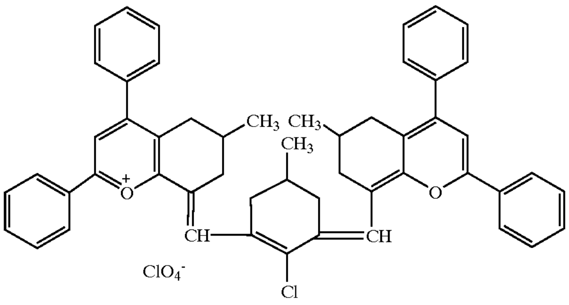

-continued
S-33
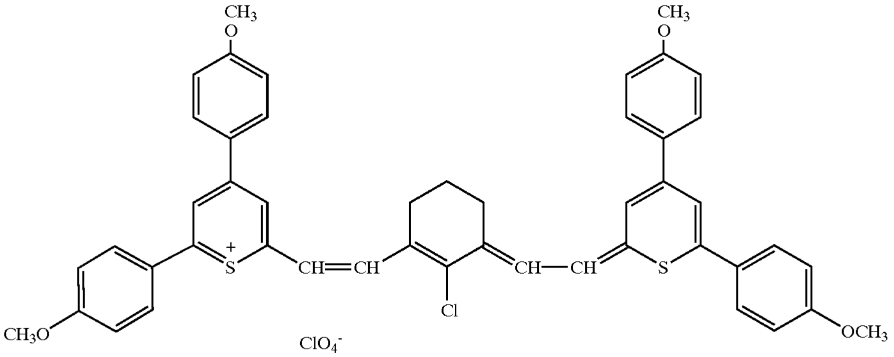
S-34
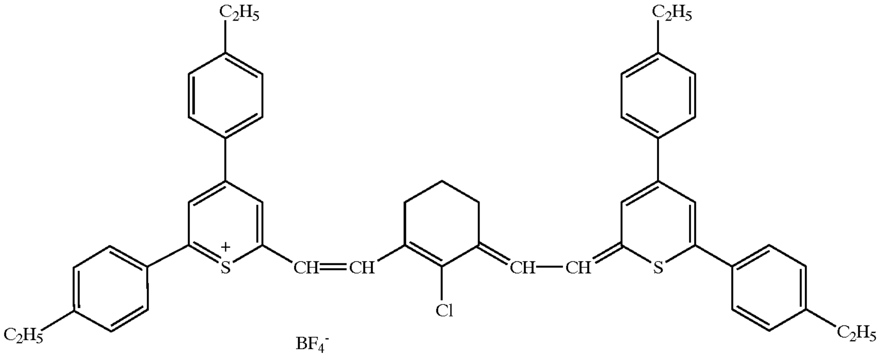
S-35
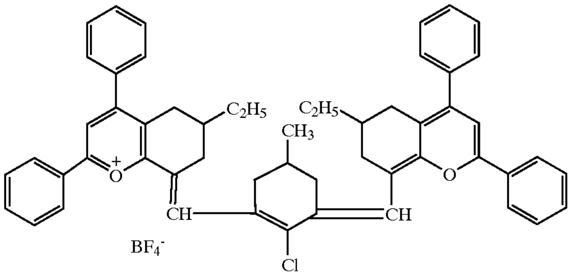
S-36
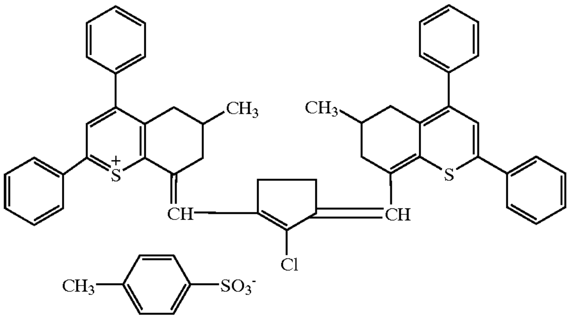
S-37
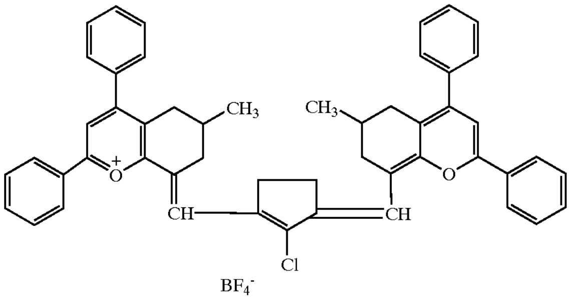
S-38
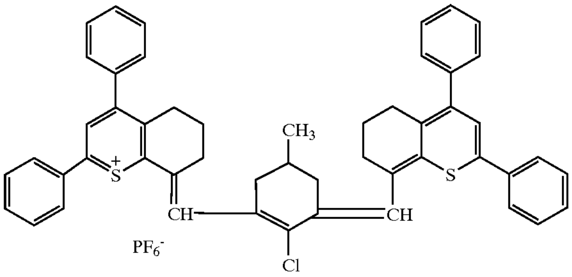

-continued
S-39
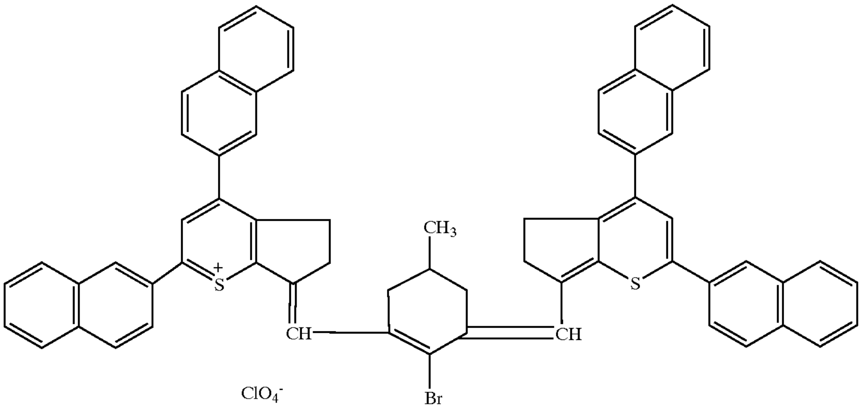
S-40
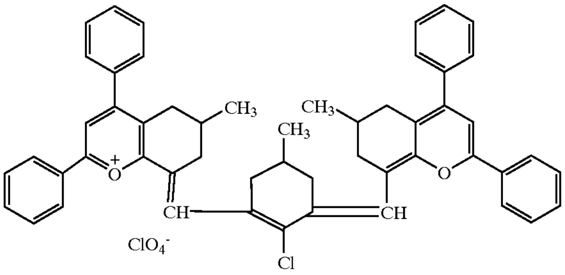
S-41
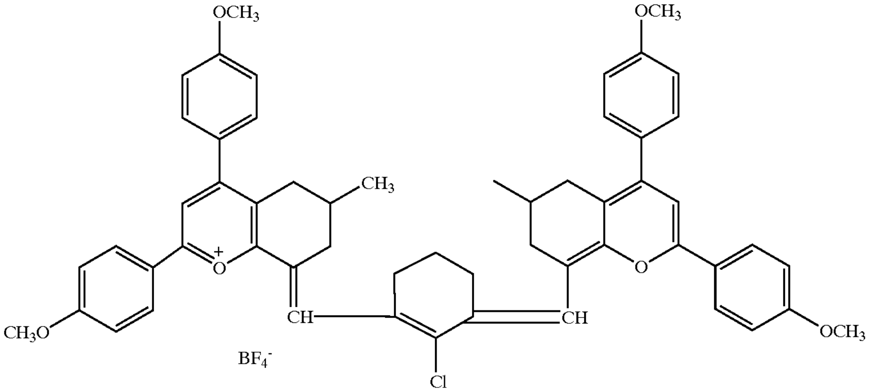
S-42
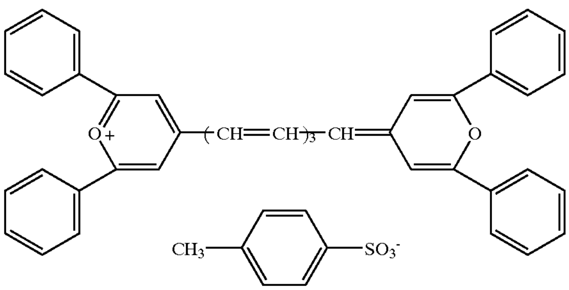
S-43
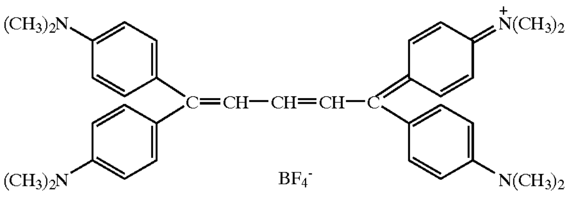
S-44
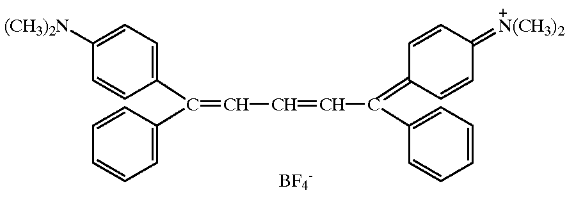
S-45
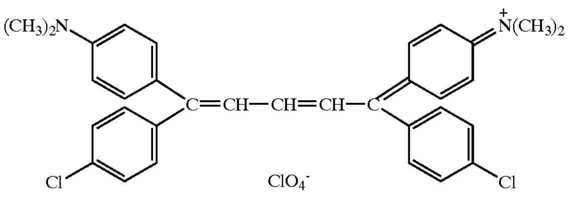

-continued

S-46

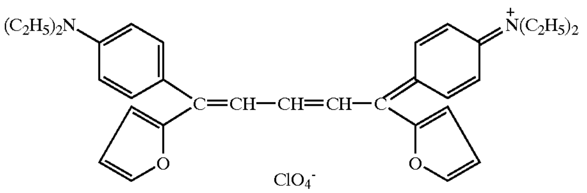

S-47

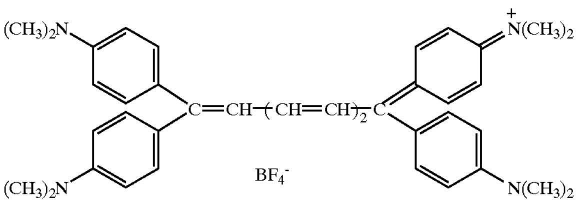

S-48

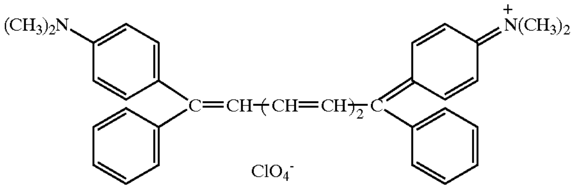

S-49

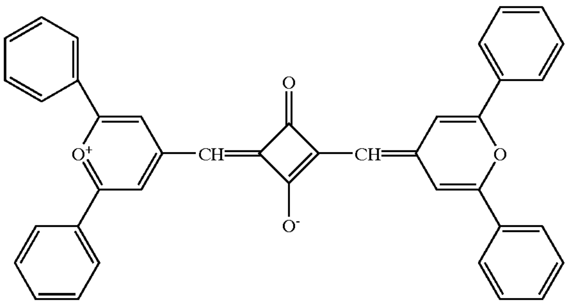

S-50

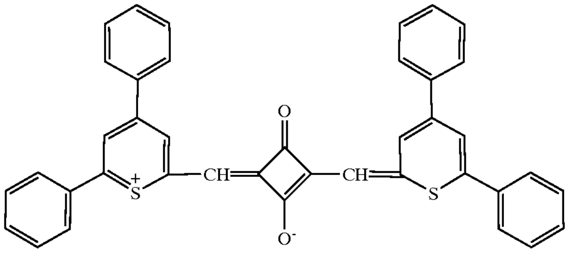

S-51

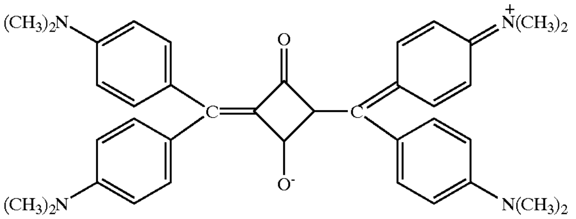

S-52

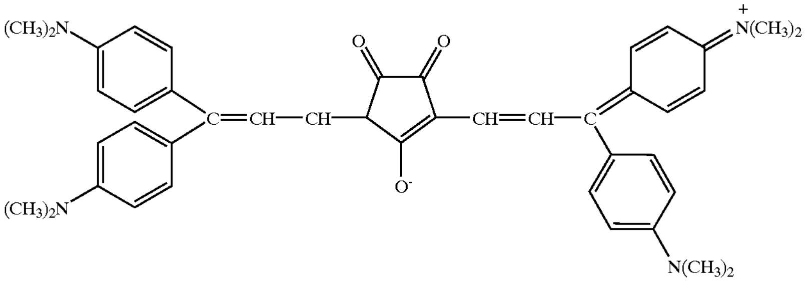

S-53

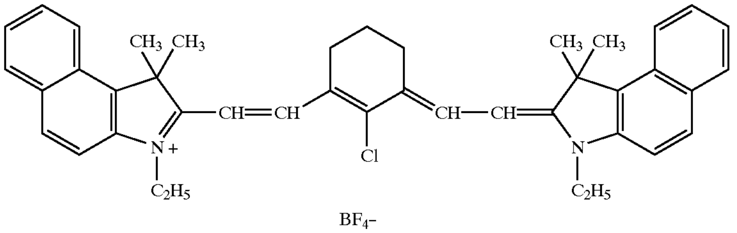

These dyes can be prepared by conventional methods.

Among these, a cyanine dye, a polymethine dye, a squarilium dye, a croconium dye, a pyrylium dye and a thiopyrylium dye are preferred. Further, a cyanine dye, a polymethine dye, a pyrylium dye and a thiopyrylium dye are more preferred.

Among these, particularly preferred is a cyanine dye of the following formula (I) or a polymethine dye of the formula (II) in a wavelength region of from 650 to 900 nm, and a pyrylium dye or a thiopyrylium dye of the following formula (III) in a wavelength region of from 800 to 1300 nm:

(I)

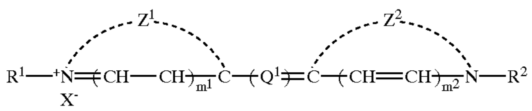

wherein each of $R^1$ and $R^2$ is a $C_{1-8}$ alkyl group which may have a substituent, wherein the substituent is a phenyl group, a phenoxy group, an alkoxy group, a sulfonic acid group, or a carboxyl group; $Q^1$ is a heptamethine group which may have a substituent, wherein the substituent is a $C_{1-8}$ alkyl group, a halogen atom or an amino group, or the heptamethine group may contain a cyclohexene ring or a cyclopentene ring having a substituent, formed by mutual bonding of substituents on two methine carbon atoms of the heptamethine group, wherein the substituent is a $C_{1-6}$ alkyl group or a halogen atom; each of $m^1$ and $m^2$ is 0 or 1; each of $Z^1$ and $Z^2$ is a group of atoms required for forming a nitrogen-containing heterocyclic ring; and $X^-$ is a counter anion.

(II)

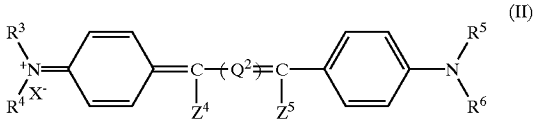

wherein each of $R^3$ to $R^6$ is a $C_{1-8}$ alkyl group; each of $Z^4$ and $Z^5$ is an aryl group which may have a substituent, wherein the aryl group is a phenyl group, a naphthyl group, a furyl group or a thienyl group, and the substituent is a $C_{1-4}$ alkyl group, a $C_{1-8}$ dialkylamino group, a $C_{1-8}$ alkoxy group and a halogen atom; $Q^2$ is a trimethine group or a pentamethine group; and $X^-$ is a counter anion.

(III)

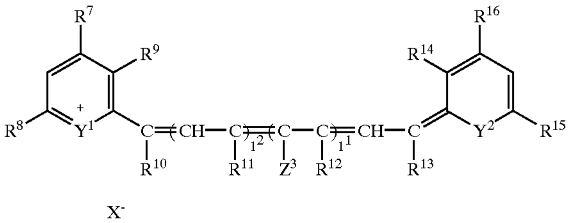

wherein each of $Y^1$ and $Y^2$ is an oxygen atom or a sulfur atom, each of $R^7$, $R^8$, $R^{15}$ and $R^{16}$ is a phenyl group or a naphthyl group which may have a substituent, wherein the substituent is a $C_{1-8}$ alkyl group or a $C_{1-8}$ alkoxy group; each of $l^1$ and $l^2$ which are independent of each other, is 0 or 1; each of $R^9$ to $R^{14}$ is a hydrogen atom or a $C_{1-8}$ alkyl group, or $R^9$ and $R^{10}$, $R^{11}$ and $R^{12}$, or $R^{13}$ and $R^{14}$, are bonded to each other to form a linking group of the formula:

(IV)

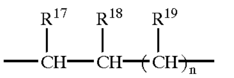

wherein each of $R^{17}$ to $R^{19}$ is a hydrogen atom or a $C_{1-6}$ alkyl group, and n is 0 or 1; $Z^3$ is a halogen atom or a hydrogen atom; and $X^-$ is a counter anion.

The counter anion $X^-$ in each of the above formulas (I), (II) and (III) may, for example, be an inorganic acid anion such as $Cl^-$, $Br^-$, $I^-$, $ClO_4^-$, $BF_4^-$ or $PF_6^-$, or an organic acid anion such as a benzenesulfonic acid, p-toluenesulfonic acid, naphthalene-1-sulfonic acid or acetic acid.

The proportion of such a light-absorbing dye in the positive photosensitive composition of the present invention is preferably from 0.1 to 30 wt %, more preferably from 1 to 20 wt %.

Now, the high molecular compound (hereinafter referred to as a polymer or a resin) (b), of which the solubility in an alkali developer is changeable mainly by a change other than a chemical change, as the second component used for the positive photosensitive composition of the present invention, will be described. As such a polymer, alkali-soluble resins such as a novolak resin, a resol resin, a polyvinyl phenol resin and a copolymer of an acrylic acid derivative, may, for example, be mentioned. Among them, a novolak resin or a polyvinyl phenol resin is preferred.

The novolak resin may be one prepared by polycondensing at least one member selected from aromatic hydrocarbons such as phenol, m-cresol, o-cresol, p-cresol, 2,5-xylenol, 3,5-xylenol, resorcinol, pyrogallol, bisphenol, bisphenol-A, trisphenol, o-ethyphenol, m-ethylphenyl, p-ethylphenol, propylphenol, n-butylphenol, t-butylphenol, 1-naphthol and 2-naphthol, with at least one aldehyde or ketone selected from aldehydes such as formaldehyde, acetoaldehyde, propionaldehyde, benzaldehyde and furfural and ketones such as acetone, methyl ethyl ketone and methyl isobutyl ketone, in the presence of an acid catalyst.

Instead of the formaldehyde and acetaldehyde, paraformaldehyde and paraldehyde may, respectively, be used. The weight average molecular weight calculated as polystyrene, measured by gel permeation chromatography (hereinafter referred to simply as GPC), of the novolak resin (the weight average molecular weight by the GPC measurement will hereinafter be referred to as Mw) is preferably from 1,000 to 15,000, more preferably from 1,500 to 10,000.

The aromatic hydrocarbon of a novolak resin may, for example, be preferably a novolak resin obtained by polycondensing at least one phenol selected from phenol, o-cresol, m-cresol, p-cresol, 2,5-xylenol, 3,5-xylenol and resorcinol, with at least one member selected from aldehydes such as formaldehyde, acetaldehyde and propionaldehyde.

Among them, preferred is a novolak resin which is a polycondensation product of an aldehyde with a phenol comprising m-cresol/p-cresol/2,5-xylenol/3,5-xylenol/resorcinol in a mixing molar ratio of 40 to 100/0 to 50/0 to 20/0 to 20/0 to 20, or with a phenol comprising phenol/m-cresol/p-cresol in a mixing molar ratio of 1 to 100/0 to 70/0 to 60. Among aldehydes, formaldehyde is particularly preferred. Further, as described hereinafter, the photosensitive composition of the present invention may further contain a solubility-suppressing agent. In such a case, preferred is a novolak resin which is a polycondensation product of an aldehyde with a phenol comprising m-cresol/p-cresol/2,5-xylenol/3,5-xylenol/resorcinol in a mixing molar ratio of 70 to 100/0 to 30/0 to 20/0 to 20, or with a phenol comprising phenol/m-cresol/p-cresol in a mixing molar ratio of 10 to 100/0 to 60/0 to 40.

The polyvinyl phenol resin may be a polymer of one or more hydroxystyrenes such as o-hydroxystyrene, m-hydroxystyrene, p-hydroxystyrene, 2-(o-hydroxyphenyl) propylene, 2-(m-hydroxyphenyl)propylene and 2-(p-hydroxyphenyl)propylene. Such a hydroxystyrene may have a substituent such as a halogen such as chlorine, bromine, iodine or fluorine, or a $C_{1-4}$ alkyl group, on its aromatic ring. Accordingly, the polyvinyl phenol may be a polyvinyl phenol having a halogen or a $C_{1-4}$ alkyl substituent on its aromatic ring.

The polyvinyl phenol resin is usually prepared by polymerizing one or more hydroxystyrenes which may have substituents in the presence of a radical polymerization initiator or a cationic polymerization initiator. Such a polyvinyl phenol resin may be the one subjected to partial hydrogenation. Or, it may be a resin having a part of OH groups of a polyvinyl phenol protected by e.g. t-butoxycarbonyl groups, pyranyl group, or furanyl groups. Mw of the polyvinyl phenol resin is preferably from 1,000 to 10,0000, more preferably from 1,500 to 50,000.

More preferably, the polyvinyl phenol resin is a polyvinyl phenol which may have a $C_{1-4}$ alkyl substituent on its aromatic ring, particularly preferably an unsubstituted polyvinyl phenol.

If Mw of the above novolak resin or polyvinyl phenol resin is smaller than the above range, no adequate coating film tends to be obtained, and if it exceeds the above range, the solubility of the non-exposed portion in an alkali developer tends to be small, whereby a pattern tends to be hardly obtainable.

Among the above described resins, a novolak resin is particularly preferred.

The proportion of such a resin in the positive photosensitive composition comprising the above-described components (a) and (b) to be used in the present invention, is preferably from 70 to 99.9 wt %, more preferably from 80 to 99 wt %.

The photosensitive composition of the present invention may further contain, as its component, a solubility-suppressing agent (dissolution inhibitor) (c) capable of lowering the dissolution rate, in the alkali developer, of a blend comprising a light-absorbing dye (a) and the above-mentioned alkali-soluble resin (b) (such a solubility-suppressing agent (c) will hereinafter be referred to simply as a solubility-suppressing agent).

When such a solubility-suppressing agent is incorporated in the photosensitive composition of the present invention, the photosensitive composition may sometimes exhibits an excellent positive photosensitive property. The action of the solubility-suppressing agent in the composition is not necessarily clear. However, it is believed at least that the photosensitive material made of this composition not only exhibits a solubility-suppressing characteristic at a non-exposed portion against the developer by the addition of the solubility-suppressing agent, while showing no such an effect at an exposed portion, but also often exhibits a dissolution-accelerating effect i.e. an effect of increasing the contrast between the exposed portion and the non-exposed portion, whereby an excellent positive image can be formed. However, the composition of the present invention is one, of which the solubility in an alkali developer is changed by a change other than a chemical change. Accordingly, the solubility-suppressing agent should also be a compound which undergoes no chemical change by exposure. In other words, it is a compound not susceptible to a photochemical sensitizing effect by the photo-thermal conversion material.

The photosensitive composition of the present invention contains an alkali-soluble resin (b) and a light-absorbing dye (a) as essential components. Accordingly, the solubility-suppressing agent (c) is one showing an effect of suppressing the dissolution of a blend of components (a) and (b), as mentioned above. However, it is believed that such an agent serves substantially to suppress dissolution of the alkali-soluble resin (b).

The solubility-suppressing agent must be at least a compound which is capable of suppressing, by its addition, the dissolving rate, in the alkali developer, of the blend comprising the above components (a) and (b) to a level of at most 80%, and it is preferably a compound capable of suppressing the dissolution rate to a level of at most 50%, more preferably at most 30%.

As a simple method for measuring the solubility-suppressing effect, for example, a blend of predetermined amounts of the above components (a) and (b) is firstly coated on a support, and the coated support is immersed in the alkali developer, whereby the interrelation between the immersion time and the reduction in the film thickness is obtained. Then, a predetermined amount of a sample of the solubility-suppressing agent is incorporated to the above blend, then the blend is coated in the same film thickness as above, and the relation between the immersion time and the reduction in the film thickness is obtained in the same manner. From these measured values, a ratio of the dissolution rates of the two can be obtained. Thus, the effect of lowering the dissolution rate of the sample of the solubility-suppressing agent used can be measured as such a relative rate. Specific examples wherein various suppressing agents are incorporated in an amount corresponding to 20 wt % of the novolak resin, are described in Examples given hereinafter.

It has been found that a wide range of compounds can be used as effective solubility-suppressing agents for the present invention. However, such a solubility-suppressing agent is required to remain in the photosensitive layer under a stabilized condition, and it is accordingly preferably solid at room temperature under atmospheric pressure or a liquid having a boiling point of at least 180° C. under atmospheric pressure. Such effective compounds may, for example, be sulfonic acid esters, phosphoric acid esters, aromatic carboxylic acid esters, aromatic disulfones, carboxylic anhydrides, aromatic ketones, aromatic aldehydes, aromatic amines and aromatic ethers. These compounds may be used alone or in combination as a mixture of two or more of them.

More specifically, they may, for example, be sulfonic acid esters such as ethyl benzenesulfonate, n-hexyl benzenesulfonate, phenyl benzenesulfonate, benzyl benzenesulfonate, phenylethyl benzenesulfonate, ethyl p-toluenesulfonate, t-butyl p-toluenesulfonate, n-octyl p-toluenesulfonate, 2-ethylhexyl p-toluenesulfonate, phenyl p-toluenesulfonate, phenylethyl p-toluenesulfonate, ethyl 1-naphthalenesulfonate, phenyl 2-naphthalenesulfonate, benzyl 1-naphthalenesulfonate, phenylethyl 1-naphthalenesulfonate, and bisphenyl A dimethyl sulfonate; phosphoric acid esters such as trimethyl phosphate, triethyl phosphate, tri(2-ethylhexyl)phosphate, triphenyl phosphate, tritolyl phosphate, tricresyl phosphate, and tri-(1-naphthyl)phosphate; aromatic carboxylic acid esters such as methyl benzoate, n-heptyl benzoate, phenyl benzoate, 1-naphthyl benzoate, n-octyl 1-pyridine carboxylate, and tris(n-butoxycarbonyl)-s-triazine; carboxylic anhydrides such as mono-, di- or tri-chloroacetic anhydride, phenyl succinic anhydride, maleic anhydride, phthalic anhydride, and benzoic anhydride; aromatic ketones such as benzophenone, acetophenone, benzil and 4,4'-dimethylaminobenzophenone; aldehydes such as p-dimethylaminobenzaldehyde, p-methoxybenzaldehyde, p-chlorobenzaldehyde, and 1-naphthoaldehyde; aromatic amines such as triphenylamine, diphenylamine, tritolylamine, and diphenylnaphthylamine; and aromatic ethers such as ethylene glycol diphenyl ether, 2-methoxynaphthalene, diphenyl ether, and 4,4'-diethoxybisphenol A. These compounds may be substituted by a substituent of the type not to impair the effects of the present invention, such as an alkyl group, an alkoxy group, a halogen atom or a phenyl group. Further, such a compound may have a structure in which it is combined into a polymer or a resin. For example, it may, for example, be a sulfonic acid ester supported by an ester bond on a hydroxyl group of a novolak resin or a polyvinyl phenol. Such a structure may sometimes brings about an excellent suppressing effect.

Such a solubility-suppressing agent may contain, in its structure, a compound of the type having photosensitivity to ultraviolet light, such as an o-quinone diazide group-containing compound such as an o-quinone diazide sulfonic acid ester, or an aromatic disulfone such as diphenyldisulfone, whereby an excellent image can be obtained. However, in such a case, it is usually required to carry out the operation under yellow light. Accordingly, a more preferred specific embodiment of the present invention is an embodiment wherein a solubility-suppressing agent having substantially no photosensitivity to ultraviolet light. As shown in Examples of this specification, it is a photosensitive material durable for an operation for a long period of time in an environment of white light, and such a photosensitive material will bring about a substantial merit from the practical viewpoint. Such a solubility-suppressing agent (c) which is used as the case requires, may be incorporated preferably in an amount of at most 50 wt %, more preferably at most 40 wt %, based on the total weight of the components (a) and (b).

In a case where an o-quinone diazide group-containing compound is used as the solubility-suppressing agent, if the photosensitive composition is irradiated with ultraviolet ray, a positive image can be obtained in the same manner as the conventional composition. However, the photosensitive composition of the present invention is advantageously characterized in forming an image by a light within a wavelength region of from 650 to 1300 nm, and it is believed that within this wavelength region, no substantial reaction for photo decomposition of the o-quinone diazide group-containing compound will take place. This is evident also from the disclosure in JP-A-60-175046 reading “in contrast to quinone diazide and diazonium salt which can not be sensitized or can only slightly be sensitized, an onium salt can readily be sensitized by a wide range of compounds over the entire visible and infrared regions of an electromagnetic spectrum”. However, it is known that a 1,2-diazoketone such as an o-quinone diazide group-containing compound, undergoes a decomposition reaction also by heat. Accordingly, it is likely that when a light within a wavelength region of from 650 to 1300 nm is irradiated, it may be decomposed by the heat converted by a light-absorbing dye, and as a result, an increase in the alkali solubility of the exposed portion may be brought about.

It should be understood that in the present invention, the difference in the solubility in the developer as between an exposed portion and a non-exposed portion is essentially accomplished by a combination of the light-absorbing dye and the high molecular compound, of which the solubility in an alkali developer varies depending upon the light absorption of the dye.

An o-quinone diazide group-containing compound has absorption in an ultraviolet to visible region. Accordingly, if such an o-quinone diazide group-containing compound is used as the solubility-suppressing agent, it is usually required to carry out the operation under yellow light. However, such a compound may often bring about a desirable burning property. Such an o-quinone diazide group-containing compound may, for example, be preferably an ester compound of o-quinone diazide sulfonic acid with various aromatic polyhydroxy compounds or with a polycondensed resin of a phenol and an aldehyde or ketone.

The phenol may, for example, be a monohydric phenol such as phenol, o-cresol, m-cresol, p-cresol, 3,5-xylenol, carbacrol or thimol, a dihydric phenol such as catechol, resorcinol or hydroquinone, or a trihydric phenol such as pyrogallol or fluoroglucine. The aldehyde may, for, example, be formaldehyde, benzaldehyde, acetaldehyde, croton aldehyde or furfural. Among them, preferred are formaldehyde and benzaldehyde. The ketone may, for example, be acetone or methyl ethyl ketone.

Specific examples of the polycondensed resin include a phenol/formaldehyde resin, a m-cresol/formaldehyde resin, a m- and p-mixed cresol/formaldehyde resin, a resorcinol/benzaldehyde resin, and a pyrogallol/acetone resin. The molecular weight (Mw) of such a polycondensed resin is preferably from 1,000 to 10,000, more preferably from 1,500 to 5,000.

The condensation ratio of o-quinone diazide sulfonic acid to the OH group of a phenol group of the above o-quinone diazide compound (the reaction ratio per one OH group) is preferably from 5 to 80%, more preferably from 10 to 45%.

Among the o-quinone diazide compounds, particularly preferred is an o-quinone diazide compound obtained by reacting 1,2-naphthoquinone diazide sulfonyl chloride with a pyrogallol acetone resin.

The photosensitive composition of the present invention is prepared usually by dissolving the above described various components in a suitable solvent. The solvent is not particularly limited so long as it is a solvent which presents an excellent coating film property and provides sufficient solubility for the components used. It may, for example, be a cellosolve solvent such as methylcellosolve, ethylcellosolve, methylcellosolve acetate or ethylcellosolve acetate, a propylene glycol solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate or dipropylene glycol dimethyl ether, an ester solvent such as butyl acetate, amyl acetate, ethyl butyrate, butyl butylate, diethyl oxalate, ethyl pyruvate, methyl-2-hydroxy butyrate, ethyl acetate, methyl lactate, ethyl lactate or methyl 3-methoxypropionate, an alcohol solvent such as heptanol, hexanol, diacetone alcohol or furfuryl alcohol, a ketone solvent such as cyclohexanone or methyl amyl ketone, a highly polar solvent such as dimethyl formamide, dimethyl acetamide or n-methyl pyrrolidone, or a solvent mixture thereof, or the one having an aromatic hydrocarbon added thereto. The proportion of the solvent is usually within a range of from 1 to 20 times in a weight ratio to the total amount of the photosensitive material.

The photosensitive composition of the present invention may contain various additives, such as a dye, a pigment, a coating property-improving agent, a development-improving agent, an adhesion-improving agent, a sensitivity-improving agent, an oleophilic agent, etc. within a range not to impair the performance of the composition.

As a method for coating the photosensitive composition on the surface of a support, to be used in the present invention, a conventional method such as rotational coating, wire bar coating, dip coating, air knife coating, roll coating, blade coating or curtain coating may, for example, be employed. The coated amount varies depending upon the particular use, but is usually preferably from 0.1 to 10.0 $g/m^2$ (as the solid content). The temperature for drying is, for example, from 20 to 150° C., preferably from 30 to 120° C. The support on which a photosensitive layer made of the photosensitive composition of the present invention will be formed, may, for example, be a metal plate of e.g. aluminum, zinc, steel or copper, a metal plate having chromium, zinc, copper, nickel, aluminum, iron or the like plated or vapor-deposited thereon, a paper sheet, a plastic film, a glass sheet, a resin-coated paper sheet, a paper sheet having a metal foil such as an aluminum foil bonded thereto, or a plastic film having hydrophilic treatment applied thereto. Among them, preferred is an aluminum plate. As the support for a photosensitive lithographic printing plate of the present invention, it is particularly preferred to employ an aluminum plate having grain treatment applied by brush polishing or electrolytic etching in a hydrochloric acid or nitric acid solution, having anodizing treatment applied in a sulfuric acid solvent and, if necessary, having surface treatment such as pore sealing treatment applied.

The light source for image exposure of the photosensitive lithographic printing plate of the present invention is preferably a light source for generating a near infrared laser beam of from 650 to 1,300 nm. For example, a YAG laser, a semiconductor laser or LED may be mentioned. Particularly preferred is a semiconductor laser or a YAG laser which is small in size and has a long useful life. With such a laser light source, scanning exposure is usually carried out, and then development is carried out with a developer to obtain a lithographic printing plate having a developed image.

The laser light source is used to scan the surface of a photosensitive material in the form of a high intensity light ray (beam) focused by a lens, and the sensitivity characteristic ($mJ/cm^2$) of the positive lithographic printing plate of the present invention responding thereto may sometimes depend on the light intensity ($mJ/s \cdot cm^2$) of the laser beam received at the surface of the photosensitive material. Here, the light intensity ($mJ/s \cdot cm^2$) of the laser beam can be determined by measuring the energy per unit time (mJ/s) of the laser beam on the printing plate by a light power meter, measuring also the beam diameter (the irradiation area: $cm^2$) on the surface of the photosensitive material, and dividing the energy per unit time by the irradiation area. The irradiation area of the laser beam is usually defined by the area of the portion exceeding $1/e^2$ intensity of the laser peak intensity, but it may simply be measured by sensitizing the photosensitive material showing reciprocity law.

The light intensity of the light source to be used in the present invention is preferably at least $2.0 \times 10^6$ $mJ/s \cdot cm^2$, more preferably at least $1.0 \times 10^7$ $mJ/s \cdot cm^2$. If the light intensity is within the above range, the sensitivity characteristic of the positive lithographic printing plate of the present invention can be improved, and the scanning exposure time can be shortened, such being practically very advantageous.

As the developer to be used for developing the photosensitive lithographic printing plate of the present invention, an alkali developer composed mainly of an aqueous alkali solution is preferred.

As the alkali developer, an aqueous solution of an alkali metal salt such as sodium hydroxide, potassium hydroxide, sodium carbonate, potassium carbonate, sodium metasilicate, potassium metasilicate, sodium secondary phosphate or sodium tertiary phosphate, may, for example, be mentioned. The concentration of the alkali metal salt is preferably from 0.1 to 20 wt %. Further, an anionic surfactant, an amphoteric surfactant or an organic solvent such as an alcohol, may be added to the developer, as the case requires.

Now, the present invention will be described in further detail with reference to Examples. However, it should be understood that the present invention is by no means restricted to such specific Examples.

The esterification ratio in Examples was obtained from the charged ratio.

Preparation of a Lithographic Printing Plate

Preparation of an Aluminum Plate (I)

An aluminum plate (material: 1050, hardness: E16) having a thickness of 0.24 mm was subjected to degreasing treatment at 60° C. for one minute in a 5 wt % sodium hydroxide aqueous solution and then to electrolytic etching treatment in an aqueous hydrochloric acid solution having a concentration of 0.5 mol/l at a temperature of 25° C. at a current density of 60 $A/dm^2$ for a treating time of 30 seconds. Then, it was subjected to desmut treatment in a 5 wt % sodium hydroxide aqueous solution at 60° C. for 10 seconds and then to anodizing treatment in a 20 wt % sulfuric acid solution at a temperature of 20° C. at a current density of 3 $A/dm^2$ for a treating time of one minute. Further, it was subjected to a hydrothermal pore sealing treatment with hot water of 80° C. for 20 seconds to obtain an aluminum plate (I) as a support for a lithographic printing plate.

EXAMPLES 1 to 10

A photosensitive liquid comprising the following components, was coated by a wire bar on an aluminum plate (I) prepared by the above described method and dried at 85° C. for 2 minutes, followed by stabilizing in an oven of 55° C. to obtain a photosensitive lithographic printing plate having a photosensitive layer with a film thickness of 24 $mg/dm^2$.

| Photosensitive liquid | |
|---|---|
| High molecular compound: Novolak resin as identified in Table 2 | 0.9 g |
| Light-absorbing dye: Compound as identified in Table 2 | Amount as identified in Table 2 |
| Colorant: Victoria Pure Blue BOH | 0.008 g |
| Solvent: Cyclohexanone | 9 g |

The above photosensitive lithographic printing plate was mounted on a rotary drum, and scanning exposure was carried out by a laser beam (40 mW) formed by focusing a semiconductor laser (830 nm, by Applied Techno K.K.) by a lens to a beam diameter of 25 μm, under a yellow lamp. Then, development was carried out at 25° C. for 30 seconds with a solution having an alkali developer SDR-1 (for a positive printing plate, manufactured by Konica K.K.) diluted the number of times as identified in Table 2. From the maximum number of revolutions of the drum which gave a positive image line with a width of 25 μm, the sensitivity was obtained in terms of the energy value. The results are shown in Table 2.

TABLE 2

| Examples | Novolak resin | Light-absorbing dye (wt %) | Number of diluted times of SDR-1 | Sensitivity ($mJ/cm^2$) |
|---|---|---|---|---|
| Example 1 | SK-188 | S-53 (3%) | 12 times | 110 |
| Example 2 | SK-135 | S-53 (3%) | 6 times | 80 |

TABLE 2-continued

| Examples | Novolak resin | Light-absorbing dye (wt %) | Number of diluted times of SDR-1 | Sensitivity (mJ/cm$^2$) |
|---|---|---|---|---|
| Example 3 | SK-136 | S-53 (3%) | 12 times | 100 |
| Example 4 | SK-223 | S-53 (3%) | 6 times | 80 |
| Example 5 | SK-223 | S-53 (3%) | 6 times | 75 |
| Example 6 | SK-135 | S-4 (3%) | 6 times | 180 |
| Example 7 | SK-135 | S-43 (3%) | 6 times | 80 |
| Example 8 | SK-135 | S-11 (3%) | 6 times | 120 |
| Example 9 | SK-135 | S-22 (3%) | 6 times | 140 |
| Example 10 | SK-135 | S-23 (3%) | 6 times | 140 |

In Table 2, the abbreviations in the column for "Novolak resin" represent the following novolak resins, respectively. The ratio in the bracket () represents a mol % ratio of phenol/m-cresol/p-cresol.
SK-188: SK-188, manufactured by Sumitomo Dures Company (50/30/20)
SK-135: SK-135, manufactured by Sumitomo Dures Company (10/70/30)
SK-136: SK-136, manufactured by Sumitomo Dures Company (0/90/10)
SK-223: SK-223, manufactured by Sumitomo Dures Company (5/57/38)
In Table 2, the abbreviations in the column for "Light-absorbing dye" represent the compounds as identified in Table 1, respectively.

EXAMPLES 11 TO 19

Reference Examples 1 to 3

Then, with respect to some of these photosensitive lithographic printing plates, the influence of the light intensity of the laser beam was examined by the following method.

Namely, while fixing the received energy of the semiconductor laser (830 nm) at the surface of the photosensitive material at a level of 40 mJ/s, the light intensity was changed by adjusting the focusing degree by the lens, so that the sensitivity corresponding to each light intensity was obtained. The sensitivity was obtained from the number of revolutions of the drum which gave an image (positive) reproducing the exposed beam diameter. Further, the received energy of the laser was measured by using a light power meter TQ8210 (manufactured by Advantest Company).

The results of the obtained sensitivity mJ/cm$^2$ are shown in Table 3.

TABLE 3

| Photosensitive lithographic printing plate Light intensity | Lithographic printing plate of Example 2 | | Lithographic printing plate of Example 4 | | Lithographic printing plate of Example 5 | |
|---|---|---|---|---|---|---|
| $12.7 \times 10^6$ mJ/s · cm$^2$ | Example 11 | 100 mJ/s · cm$^2$ | Example 14 | 100 mJ/s · cm$^2$ | Example 17 | 90 mJ/s · cm$^2$ |
| $8.13 \times 10^6$ | Example 12 | 300 | Example 15 | 240 | Example 18 | 160 |
| $5.66 \times 10^6$ | Example 13 | 3,600 | Example 16 | 2,700 | Example 19 | 1,800 |
| $1.04 \times 10^6$ | Reference | >7,200 | Reference | >7,200 | Reference | >7,200 |

TABLE 3-continued

| Photosensitive lithographic printing plate Light intensity | Lithographic printing plate of Example 2 | | Lithographic printing plate of Example 4 | | Lithographic printing plate of Example 5 | |
|---|---|---|---|---|---|---|
| | Example 1 | ple2 | Example 3 | | Exam- | |

In Table 3, ">7200" means that no image was formed (no dissolution of the image portion was observed) with 7200 mJ/cm$^2$.

EXAMPLES 20 TO 42

Reference Examples 4 to 8

A photosensitive liquid comprising the following components, was coated by a wire bar on an aluminum plate (I) prepared by the above-described method and dried at 85° C. for 2 minutes, followed by stabilizing in an oven of 55° C., to obtain a photosensitive lithographic printing plate having a photosensitive layer with a film thickness of 20 mg/dm$^2$.

| Photosensitive liquid | |
|---|---|
| Light-absorbing dye: Compound as identified in Table 4 | 0.015 g |
| High molecular compound: Novolak resin: the above mentioned SK-188 | 0.5 g |
| Solubility-suppressing agent: Compound as identified in Table 4 | 0.1 g |
| Solvent: Cyclohexanone | 5.3 g |

Then, evaluation was made with respect to the following items. The results are shown in Table 4.

Sensitivity

With respect to the above photosensitive lithographic printing plates, the sensitivity was determined in terms of the energy value in the same manner as in Example 1. However, the alkali developer SDR-1 was used by diluting it to a standard level (6 times).

Dissolution-suppressing Effect

The above photosensitive lithographic printing plates were immersed in an alkali developer, whereupon the time (seconds) until the respective photosensitive layers were completely dissolved, was measured. The dissolution-suppressing effect was obtained by the following formula.

$$\text{Dissolution-suppressing effect} = \frac{\text{Dissolution time of the photosensitive layer in Reference Example 4}}{\text{Dissolution time of the photosensitive layer in each Example}}$$

The lower the value of the dissolution-suppressing effect, the longer the time required for dissolution i.e. the higher the dissolution-suppressing effect.

TABLE 4

| | Light-absorbing dye | Solubility-suppressing agent | Sensitivity (mJ/-cm$^2$) | Dissolution-suppressing effect |
|---|---|---|---|---|
| Example 20 | S-1 | Phenylethyl p-toluenesulfonate | 110 | 0.25 |
| Example 21 | S-1 | Ethyl p-toluenesulfonate | 110 | 0.4 |
| Example 22 | S-1 | Phenyl p-toluenesulfonate | 110 | 0.3 |
| Example 23 | S-1 | 1,2,3-pyrogarolditosilate | 80 | 0.2 |
| Example 24 | S-1 | Tris(2-ethyihexyl) phosphate | 110 | 0.15 |
| Example 25 | S-1 | Triphenyl phosphate | 110 | 0.1 |
| Example 26 | S-1 | Dimethyl phthalate | 110 | 0.4 |
| Example 27 | S-1 | Diphenyl disulfone | 80 | 0.15 |
| Example 28 | S-1 | Benzophenone | 80 | 0.1 |
| Example 29 | S-1 | p-Dimethylamino benzaldehyde | 80 | 0.2 |
| Example 30 | S-1 | Triphenylamine | 80 | 0.1 |
| Example 31 | S-1 | Ethylene glycol phenyl ether | 80 | 0.15 |
| Example 32 | S-1 | 2-Methoxynaphthalene | 8a | 0.35 |
| Example 33 | S-1 | Monochloroacetic anhydride | 110 | 0.05 |
| Example 34 | S-1 | Phenylmaleic anhydride | 80 | 0.3 |
| Example 35 | S-1 | p-Toluene sulfonic acid ester of pyrogallol-acetone resin *1 | 110 | 0.25 |
| Example 36 | S-1 | 5-Naphthoquinone diazide sulfonic acid ester of pyrogallol-acetone resin *1 | 110 | 0.2 |
| Example 37 | S-4 | Phenylethyl p-toluenesulfonate | 220 | 0.3 |
| Example 38 | S-43 | bPhenylethyl p-toluenesulfonate | 80 | 0.25 |
| Example 39 | S-8 | Phenylethyl p-toluenesulfonate | 80 | 0.2 |
| Example 40 | S-13 | Phenylethyl p-toluenesulfonate | 110 | 0.25 |
| Example 41 | S-21 | Phenylethyl p-toluenesulfonate | 140 | 0.25 |
| Example 42 | S-25 | Phenylethyl p-toluenesulfonate | 160 | 0.2 |
| Reference Example 4 | S-1 | Nil | No image formed | 1 |
| Reference Example 5 | S-1 | Trimethylol ethane | No image formed | 0.9 |
| Reference Example 6 | | 1,4-Cyclohexadione | No image formed | 1 |
| Reference Example 7 | S-1 | 1,4-Cyclohexadiol | No image formed | >1 |
| Reference Example 8 | S-1 | Benzoic acid | No image formed | >1 |

*1 Average molecular weight of the pyrogallol-acetone resin: 2500, esterification ratio: 20%

In Table 4, the abbreviations in the column for "Light-absorbing dye" represents the compounds as identified in Table 1, respectively. Further, "no image formed" in the column for "Sensitivity" means that the photosensitive layer was completely dissolved.

EXAMPLE 43

A photosensitive lithographic printing plate was prepared to have a photosensitive layer having the same compositional ratio as in Example 20, and using a semiconductor laser under the same conditions as in Example 20, a printing pattern was baked with an exposure of 150 mJ/cm$^2$ to obtain a printing plate. Using this printing plate, printing of 40000 sheets was carried out, whereby good printed images were obtained.

EXAMPLE 44

The same photosensitive material as in Example 20, was subjected to entire-surface exposure for 2 hours at a distance of 2 m from a light source comprising two white fluorescent lamps of 40 W (FLR 40 SW, manufactured by Mitsubishi Denki Kabushiki Kaisha), and then image exposure was carried out in the same manner as in Example 20. As a result, a good positive image similar to the one obtained in Example 20, was obtained, and no particular abnormality was observed.

EXAMPLE 45

The same photosensitive material as in Example 33 was evaluated under the same conditions as in Example 44, whereby a similar good positive image was obtained.

EXAMPLE 46

The same photosensitive material as in Example 25 was evaluated under the same conditions as in Example 44, whereby a similar good positive image was obtained.

Comparative Example 1

Using the same light-absorbing dye as used in Example 20 and using a photosensitive liquid having the following composition, coating and drying were carried out in the same manner to obtain a chemical amplification type negative photosensitive material.

| | |
|---|---|
| High molecular compound: Same as used in Example 20 | 0.5 g |
| Light-absorbing dye: Same as used in Example 20 | 0.015 g |
| Crosslinking agent Cymel 300 (manufactured by Mitsui Cyanamid Company) | 0.1 g |
| Tris(trichloromethyl)-s-triazine | 0.015 g |

The obtained photosensitive material was subjected to entire-surface exposure under the same conditions as in Example 44, then subjected to image exposure in the same manner, heated at 100° C. for 3 minutes and then developed with the same developer. As a result, heavy fogging was observed over the entire surface, and no negative image was obtained.

Comparative Example 2

Using a commercially available positive PS plate KM-3 (manufactured by Konica Company), entire surface exposure was carried out under the same conditions as in Example 44, and development was carried out with the same developer. As a result, the image was dissolved over the entire surface, and no positive image was obtained.

EXAMPLES 47 TO 60

Reference Examples 9 to 14

A photosensitive liquid comprising the following components, was coated by a wire bar on an aluminum plate (I) prepared by the above-described method and dried at 85° C. for 2 minutes, followed by stabilizing in an oven of 55° C. to obtain a photosensitive lithographic printing plate as identified in Table 5 (A to F) having a photosensitive layer with a thickness of 24 mg/dm$^2$.

| Photosensitive liquid | |
|---|---|
| Light-absorbing dye: S-53 (compound as identified in Table 1) | 0.0135 g |
| High molecular compound: above mentioned SK-188 | 0.5 g |
| Solubility-suppressing agent: compound as identified in Table 5 | 0.15 g |
| Colorant: Victoria Pure Blue BOH | 0.004 g |
| Solvent: cyclohexanone | 5.5 g |

TABLE 5

| Photosensitive lithographic printing plate | Solubility-suppressing agent |
|---|---|
| A | p-Toluene sulfonic acid ester of pyrogallol/acetone resin *1 |
| B | 5-Naphthoquinone diazide sulfonic acid ester of pyrogallol/acetone resin *1 |
| C | Triphenylamine |
| D | Ethylene glycol diphenyl ether |
| E | Triphenyl phosphate |
| F | Monochloroacetic anhydride |

*1 weight average molecular weight of pyrogallol/acetone resin: 2,500, esterification ratio: 20%

Then, with respect to these photosensitive lithographic printing plates, the influence of light intensity was examined by the same method as in Example 11 using the same semiconductor laser.

As shown in Table 6, the light intensity was changed at four levels, whereby the sensitivities corresponding to the respective levels were obtained. The results are shown in Table 6.

| Photosensitive liquid | |
|---|---|
| High molecular compound: novolak resin SK-135 | 0.9 g |
| Light-absorbing dye: compound as identified in Table 7 | 0.027 g |
| Colorant: Victoria Pure Blue BOH | 0.008 g |
| Solvent: cyclohexanone/chloroform (= 3 V/1 V) | 12 g |

Then, the above photosensitive lithographic printing plate was mounted on a rotary drum, and scanning exposure was carried out by a laser beam (480 mW) formed by focusing a YAG laser (1064 nm, by Applied Techno K.K.) by a lens to a beam diameter of 30 μm, under a yellow lamp. Then, an alkali developer SDR-1 (for a positive printing plate, manufactured by Konica K.K.) was diluted 6 times, and development was carried out at 25° C. for 30 seconds. From the maximum number of revolutions of the drum which gave a positive image line with a width of 30 μm, the sensitivity was obtained in terms of the energy value. The results are shown in Table 7.

TABLE 7

| | Light-absorbing dye | Sensitivity ($mJ/cm^2$) |
|---|---|---|
| Example 61 | S-40 | 230 |
| Example 62 | S-25 | 170 |
| Example 63 | S-31 | 190 |
| Example 64 | S-22 | 170 |
| Example 65 | S-23 | 210 |
| Example 66 | S-28 | 190 |
| Example 67 | S-35 | 190 |

TABLE 6

| Photosensitive lithographic printing plate Light intensity | A | | B | | C | | D | | E | | F | |
|---|---|---|---|---|---|---|---|---|---|---|---|---|
| $12.7 \times 10^6$ $mJ/s \cdot cm^2$ | Example 47 | 100 $mJ/s \cdot cm^2$ | Example 50 | 120 $mJ/s \cdot cm^2$ | Example 53 | 80 $mJ/s \cdot cm^2$ | Example 55 | 100 $mJ/s \cdot cm^2$ | Example 57 | 100 $mJ/s \cdot cm^2$ | Example 59 | 120 $mJ/s \cdot cm^2$ |
| $8.13 \times 10^6$ | Example 48 | 690 | Example 51 | 400 | | — | | — | | — | | — |
| $5.66 \times 10^6$ | Example 49 | 3,600 | Example 52 | 1,600 | Example 54 | 1,300 | Example 56 | 3,000 | Example 58 | 3,000 | Example 60 | 3,600 |
| $1.04 \times 10^6$ | Reference Exampla 9 | >7,200 | Reference Example 10 | >7,200 | Reference Example 11 | >7,200 | Reference Example 12 | >7,200 | Reference Example 13 | >7,200 | Reference Example 14 | >7,200 |

In Table 6, ">7200" means that no image was formed (no dissolution of the image portion was observed) with 7200 $mJ/cm^2$.

EXAMPLES 61 TO 67

A photosensitive liquid comprising the following components, was coated by a wire bar on an aluminum plate (I) prepared by the above-described method and dried at 85° C. for two minutes, followed by stabilizing in an oven at 55° C. to obtain a photosensitive lithographic printing plate having a photosensitive layer with a film thickness of 24 $mg/dm^2$.

EXAMPLES 68 TO 73

Reference Examples 15 and 16

Then, with respect to some of these photosensitive lithographic printing plates, the influence of light intensity of a YAG laser beam was examined by the following method.

Namely, the sensitivity was obtained in the same manner as in Example 11 except that the semiconductor laser (830 nm, 40 mW) in Example 11 was changed to the above YAG laser (1064 nm, 480 mW), i.e. the light intensity was changed by adjusting the focusing degree by a lens and the sensitivity corresponding to each beam diameter was obtained in the same manner as in Example 11.

The results of the obtained sensitivity are shown in Table 8.

TABLE 8

| Photosensitive lithographic printing plate Light intensity | Lithographic printing plate of Example 61 | | Lithographic printing plate of Example 64 | |
|---|---|---|---|---|
| $53 \times 10^6$ mJ/s ·]$cm^2$ | Example 68 | 230 mJ/s · $cm^2$ | Example 71 | 170 mJ/s · $cm^2$ |
| $9.8 \times 10^6$ | Example 69 | 2,140 | Example | 1,430 |
| $4.8 \times 10^6$ | Example 70 | 6.000 | Example 73 | 4,500 |
| $1.75 \times 10^6$ | Refe-rence Example 15 | >8,000 | Refe-rence Example 16 | >8,000 |

In Table 8, ">8000" means that no positive image was formed (no dissolution of the image portion was observed) with 8000 mJ/$cm^2$.

Reference Examples

As shown in the following Reference Examples, the positive image-forming mechanism of the present invention is distinctly different from the conventional positive image-forming mechanism accompanying a photochemical change. Namely, in the photosensitive layer of the present invention, the phenomenon of increased solubility formed at a portion exposed to a laser readily diminishes or disappears by heat treatment. This will specifically be exemplified below.

Reference Examples 17 to 23

Preparation of an Aluminum Plate (II)

An aluminum plate (material: 1050, hardness: H16) having a thickness of 0.24 mm was subjected to degreasing treatment at 60° C. for one minute in a 5 wt % sodium hydroxide aqueous solution and then to electrolytic etching treatment in an aqueous hydrochloric acid solution having a concentration of 0.5 mol/l at a temperature of 28° C. at a current density of 55 A/$dm^2$ for a treating time of 40 seconds. Then, it was subjected to desmut treatment in a 4 wt % sodium hydroxide aqueous solution at 60° C. for 12 seconds and then to anodizing treatment in a 20 wt % sulfuric acid solution at a temperature of 20° C. at a current density of 3.5 A/$dm^2$ for a treating time of one minute. Further, it was subjected to a hydrothermal pore sealing treatment with hot water of 80° C. for 20 seconds to obtain an aluminum plate as a support for a lithographic printing plate (II).

A photosensitive liquid comprising the following components, was coated by a wire bar on the aluminum plate (II) prepared by the above described method and dried at 85° C. for 2 hours.

| Photosensitive liquid | |
|---|---|
| High molecular compound: one as identified in Table 5 | 3.6 g |
| Light-absorbing dye: S-53 | 0.12 g |
| Solubility-suppressing agent: one as identified in Table 9, when used | 0.72 g |
| Colorant: Victoria Pure Blue BOH | 0.032 g |
| Cyclohexanone | 37 g |

With respect to a sample of the obtained photosensitive printing plate, the change in the dissolution property of an exposed portion was examined as follows.

Firstly, each sample was exposed by a semiconductor laser or a high pressure mercury lamp and then developed. In the former case, exposure was carried out with an exposure of 200 mJ/$cm^2$ in the same manner as in Example 1 and in the latter case, exposure was carried out via a step tablet with a quantity of light giving one clear step. Then, each sample was developed in the same manner as in Example 1.

The photosensitive layer-remaining ratio at the exposed portion of the positive image thus obtained, was of course 0%. Then, another photosensitive printing plate prepared in the same manner was exposed under the same conditions and then prior to the developing step, a heat treatment step of maintaining at 55° C. for 20 hours was inserted, whereby the dissolving property of the exposed portion was reduced, and at the obtainable positive image portion, the photosensitive layer was not adequately removed, and a residual film was usually observed. In such a case, the photosensitive layer-remaining ratio (X) at the exposed portion can be obtained by measuring the dissolution rates of the exposed and non-exposed portions, and such a value will be an index for the degree of reversibility. The obtained results are shown in Table 9.

TABLE 9

| | Components of photosensitive layer | | | | Photosensitive layer-remaining ratio (X) |
|---|---|---|---|---|---|
| | High molecular compound | Light-absorbing dye | Solubility-suppressing agent | Exposure light source | |
| Reference Example 17 | PR-4 *1 | S-53 | NQD | IR | 66% |
| Reference Example 18 | PR-4 | S-53 | NQD | UV | <5% |
| Reference Example 19 | SK-135 *2 | S-53 | — | IR | 37% |
| Reference Example 20 | PR-4 | S-53 | — | IR | 62% |

TABLE 9-continued

| | Components of photosensitive layer | | | | Photosensitive |
|---|---|---|---|---|---|
| | High molecular compound | Light-absorbing dye | Solubility-suppressing agent | layer-Exposure light source | remaining ratio (X) |
| Reference Example 21 | PR-4 | S-53 | Triphenyl-amine | IR | 71% |
| Reference Example 22 | PR-4 | S-53 | Ethylene glycol diphenyl ether | IR | 76% |
| Reference Example 23 | PR-4 | S-53 | p-Toluene sulfonic acid ester of pyrogallol/acetone resin (MW 2500), esterification ratio: 20% | IR | 87% |

In Table 9, among abbreviations in the column for "Exposure light source", IR represents the same semiconductor laser as used in Example 1, and UV represents a high pressure mercury lamp.
In Table 9, an abbreviation "NQD" in the column for "Solubility-suppressing agent" represents pentahydroxybenzophenone naphthoquinone diazide sulfonic acid ester, esterification ratio: 85%.
*1 and *2: manufactured by Sumitomo Dures Company From the results shown in Table 9, the following can be assumed. Firstly, the photosensitive layers used in Reference Examples 17 and 18 are the same, and they contained naphthoquinone diazide and an infrared-absorbing dye, but in the case of Reference Example 18 where UV exposure was carried out, a known photochemical change resulted, and even via heat treatment, the dissolution property by exposure was maintained. On the other hand, as shown in Reference Example 17, in the case where infrared laser exposure was carried out, the dissolution property was substantially reduced, and the photosensitive layer at the exposed portion partially remained. This indicates that in the latter, the change is attributable to some thermal physical change mechanism other than a photochemical change. Further, also in the cases wherein infrared laser was applied to various photosensitive layers shown in Reference Examples 19 to 23, a behavior similar to Reference Example 17 was shown, and the mechanism is assumed to be the same as in Reference Example 17.

EXAMPLES 74 TO 77

Comparative Examples 3 and 4

A photosensitive liquid comprising the following components, was coated by a wire bar on an aluminum plate (I) prepared by the above-described method and dried at 85° C. for 2 minutes, followed by stabilizing in an oven of 55° C. to obtain a photosensitive lithographic printing plate having a photosensitive layer with a film thickness of 20 mg/dm$^2$.

| Photosensitive liquid | |
|---|---|
| Light-absorbing dye: compound as identified in Table 10 | 0.02 g |
| Alkali-soluble resin: m-cresol/p-cresol/phenol novolak resin (SK-188) | 0.5 g |
| Solubility-suppressing agent: compound as identified in Table 10 | Amount as identified in Table 10 |
| Solvent: cyclohexanone | 5.5 g |

Then, evaluation was carried out with respect to the following items. The results are shown in Table 10.

Safe Light Property

The above photosensitive lithographic printing plate was exposed for 5 hours at a position of 1.5 m from two white lamps of 40 W and then developed with a developer prepared by diluting a positive developer SDR-1 manufactured by Konica K.K. to 6 times, whereupon the reflection density was measured by a reflection densitometer manufactured by Macbeth Company, and it was converted to a film-remaining ratio.

TABLE 10

| | Light-absorbing dye | Solubility-suppressing agent | | Safe light property |
|---|---|---|---|---|
| | | Type | Amount (g) | |
| Example 74 | S-53 | Y-1 | 0.1 | 100% |
| Example 75 | S-53 | Y-2 | 0.1 | 100% |
| Example 76 | S-53 | Y-3 | 0.1 | 100% |
| Example 77 | S-53 | Nil | — | 100% |
| Comparative Example 3 | S-53 | Y-4 | 0.025 | 67% |
| Comparative Example 4 | S-53 | Y-5 | 0.025 | 86% |

In Table 10, abbreviations in the column for "Solubility-suppressing agent" represents the following cornpounds:
Y-1: naphthyl sulfonic acid ester of pyrogallol/acetone resin (Mw = 2500), esterification ratio: 20%
Y-2: p-toluene sulfonic acid ester of pyrogallol/acetone resin (Mw = 2500), esterification ratio: 20%
Y-3: 2-phenylethyl p-tolunate
Y-4: diphenyliodonium p-toluenesulfonate
Y-5: triphenyl sulfonium trifluoromethane

EXAMPLES 78

Comparative Examples 5, 6 and 7

A photosensitive liquid comprising the following components, was coated by a wire bar on an aluminum plate (I) prepared by the above-described method and dried at 85° C. for 2 minutes, followed by stabilizing in an oven of 55° C. to obtain a photosensitive lithographic printing plate having a photosensitive layer with a film thickness of 20 mg/dm$^2$.

| Photosensitive liquid | |
|---|---|
| Light-absorbing dye: compound as identified in Table 11 | 0.02 g |
| Alkali-soluble resin: m-cresol/p-cresol/phenol novolak resin (SK-188) | 0.5 g |
| Solubility-suppressing agent: compound as identified in Table 11 | Amount as identified in Table 11 |
| Solvent: cyclohexanone | 5.5 g |

Then, evaluation was carried out with respect to the following items. The results are shown in Table 10.

Burning Property

The above photosensitive lithographic printing plate was heated in an oven at 200° C. for 6 minutes, and then immersed in Matsui Cleaning Agent (cleaning oil for printing) for 5 minutes. The reflection density was measured by a reflection densitometer manufactured by Macbeth Company, and the film-remaining ratio was evaluated.

TABLE 11

| | Light-absorbing dye | Solubility-suppressing agent Type | Amount (g) | Burning property Immersed for 5 minutes |
|---|---|---|---|---|
| Example 78 | S-53 | Y-6 | 0.1 | 100% |
| Comparative Example 5 | S-53 | Y-4 | 0.025 | 0% |
| Cornparative Example 6 | S-53 | Y-5 | 0.025 | 0% |
| Comparative Example 7 | S-53 | Nil | — | 0% |

Y-4: diphenyliodonium p-toluenesulfonate
Y-5: triphenyl sulfonium trifluoromethane sulfonate
Y-6: naphthoquinone diazide 5-sulfonic acid ester of pyrogallol/acetone resin (esterification ratio: 20%)

Among solubility-suppressing agents, the onium salt has a photosensitivity by itself, and accordingly, the amount was controlled so that the absorbance at the same wavelength would not be excessive.

According to the present invention, it is possible to provide a positive photosensitive composition which has an excellent sensitivity characteristic particularly to a near infrared laser beam, which requires no post heat treatment and makes the operation under white light possible and which has a very simple structure; and a positive photosensitive lithographic printing plate and a method for making a positive photosensitive lithographic printing plate, employing such a composition.

What is claimed is:

1. A method for making a lithographic printing plate, comprising:

exposing a positive photosensitive lithographic printing plate comprising a positive photosensitive composition on a support, wherein the positive photosensitive composition comprises (a) a photo-thermal conversion material, and (b) a high molecular compound wherein said high molecular compound (b) has a solubility in an aqueous alkali developer which changes as a result of a change, other than a chemical change, in said high molecular compound (b);

wherein the solubility in an aqueous alkali developer of said composition is greater in a photo-thermally exposed portion than a non-exposed portion;

wherein said exposing is accomplished by means of a light ray belonging to a wavelength region of from 650 to 1300 nm and having a light intensity of at least $2\times10^6$ mJ/s·cm$^2$, and developing the positive photosensitive lithographic printing plate with an alkali developer, wherein said photosensitive composition has substantially no photosensitivity to ultraviolet light.

2. The method of claim 1, wherein the light intensity is at least $1\times10^7$ mJ/s·cm$^2$.

3. The method of claim 1 wherein said exposing is accomplished by means of a light ray belonging to a wavelength region of from 650 to 1100 nm.

4. The method for making a lithographic printing plate according to claim 1, wherein the light source for the light ray is a semiconductor laser or a YAG laser.

5. The method of claim 1 wherein the positive photosensitive composition further contains (c) a solubility-suppressing agent, wherein said solubility-suppressing agent (c) is capable of lowering the dissolution rate of a blend of component (a) and component (b) in said aqueous alkali developer.

6. The method of claim 5, wherein the solubility-suppressing agent (c) is at least one functional compound selected from the group consisting of a sulfonic acid ester, a phosphoric acid ester, an aromatic carboxylic acid ester, a carboxylic anhydride, an aromatic ketone, an aromatic aldehyde, an aromatic amine, an aromatic ether, a substituted compound thereof and a polymeric material having a structure in which said functional compound is combined into a polymer or a resin.

7. A method for making a lithographic printing plate, comprising:

exposing a positive photosensitive lithographic printing plate comprising a positive photosensitive composition on a support, wherein the positive photosensitive composition comprises (a) a photo-thermal conversion material, and (b) a high molecular compound wherein said high molecular compound (b) has a solubility in an aqueous alkali developer which changes as a result of a change, other than a chemical change, in said high molecular compound (b);

wherein the solubility in an aqueous alkali developer of said composition is greater in a photo-thermally exposed portion than a non-exposed portion;

wherein said exposing is accomplished by means of a light ray belonging to a wavelength region of from 650 to 1300 nm and having a light intensity of at least $2\times10^6$ mJ/s·cm$^2$, and developing the positive photosensitive lithographic printing plate with an alkali developer, wherein the positive photosensitive composition further contains (c) a solubility-suppressing agent, wherein said solubility-suppressing agent (c) is capable of lowering the dissolution rate of a blend of component (a) and component (b) in said aqueous alkali developer, and wherein the solubility-suppressing agent (c) is a compound having substantially no photosensitivity to ultraviolet light.

8. A method for making a positive photosensitive lithographic printing plate comprising exposing a positive photosensitive lithographic printing plate having a positive photosensitive composition on a support, said photosensitive composition comprising (a) a photo-thermal conversion material; and (b) a high molecular compound;

wherein the solubility in an aqueous alkali developer of said composition is greater in a photo-thermally exposed portion than a non-exposed portion;

with the proviso that

B<A, where A is the solubility in an alkali developer at an exposed portion of the composition, and B is an alkali solubility after heating of the exposed portion;

wherein said exposing is accomplished by means of a light ray belonging to a wavelength region of from 650 to 1300 nm and having a light intensity of at least $2\times10^6$ mJ/s·cm$^2$, and developing the positive photosensitive lithographic printing plate with an alkali developer, wherein said photosensitive composition has substantially no photosensitivity to ultraviolet light.

9. The method of claim 8 wherein the light intensity is at least $1\times10^7$ mJ/s·cm$^2$.

10. The method of claim 8 wherein said exposing is accomplished by means of a light ray belonging to a wavelength region of from 650 to 1100 nm.

11. The method for making a positive photosensitive lithographic printing plate according to claim 8, wherein the light source for the light ray is a semiconductor laser or a YAG laser.

12. The method of claim 8 wherein the positive photosensitive composition further contains (c), a solubility-suppressing agent, wherein said solubility-suppressing agent (c) is capable of lowering the dissolution rate of a blend of component (a) and component (b) in said aqueous alkali developer.

13. The method of claim 12 wherein the solubility-suppressing agent (c) is at least one functional compound selected from the group consisting of a sulfonic acid ester, a phosphoric acid ester, an aromatic carboxylic acid ester, a carboxylic anhydride, an aromatic ketone, an aromatic aldehyde, an aromatic amine, an aromatic ether, a substituted compound thereof and a polymeric material having a structure in which said functional compound is combined into a polymer or a resin.

14. The method of claim 12 wherein the solubility-suppressing agent (c) is a compound having substantially no photosensitivity to ultraviolet light.

15. The method of claim 1, wherein the photo-thermal conversion material (a) is a light-absorbing dye having an absorption band, covering a part or the whole, of a wavelength region of from 650 to 1100 nm.

16. The method of claim 1, wherein the photo-thermal conversion material (a) is at least one compound selected from the group consisting of a cyanine dye, a polymethine dye, a squarilium dye, a croconium dye, a pyrylium dye and a thiopyrylium dye.

17. The method of claim 1, wherein the photo-thermal conversion material (a) is at least one compound selected from the group consisting of a cyanine dye of formula (I), (I)

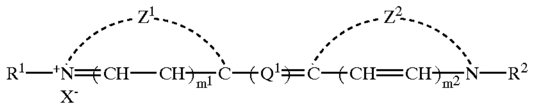

wherein each of $R^1$ and $R^2$ is a $C_{1-8}$ alkyl group which may have a substituent, wherein the substituent is a phenyl group, a phenoxy group, an alkoxy group, a sulfonic acid group, or a carboxyl group; $Q^1$ is a heptamethine group which may have a substitutent, wherein the substituent is a $C_{1-8}$ alkyl group, a halogen atom or an amino group, or the heptamethine group may contain a cyclohexene ring or a cyclopentene ring having a substituent, formed by mutual bonding of substituents on two methine carbon atoms of the heptamethine group, wherein the substituent is a $C_{1-6}$ alkyl group or a halogen atom; each of $m^1$ and $m^2$ is 0 or 1; each of $Z^1$ and $Z^2$ is a group of atoms required for forming a nitrogen-containing heterocyclic ring; and $X^-$ is a counter anion;

a polymethine dye of formula (II), (II)

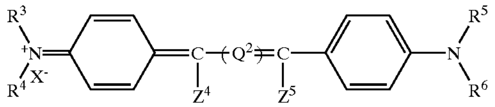

wherein each of $R^3$ to $R^6$ is a $C_{1-8}$ alkyl group; each of $Z^4$ and $Z^5$ is an aryl group which may have a substituent, wherein the aryl group is a phenyl group, a naphthyl group, a furyl group or a thienyl group, and the substituent is a $C_{1-4}$ alkyl group, a $C_{1-8}$ dialkylamino group, a $C_{1-8}$ alkoxy group and a halogen atom; $Q^2$ is a trimethine group or a pentamethine group; and $X^-$ is a counter anion; and a pyrylium or thiopyrylium dye of formula (III)

(III)

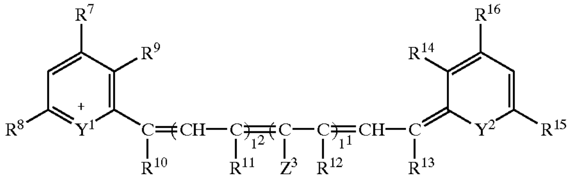

wherein each of $Y^1$ *and* $Y2$ is an oxygen atom or a sulfur atom, each of $R^7$, $R^8$, $R^{15}$ and $R^{16}$ is a phenyl group or a naphthyl group which may have a substituent, wherein the substituent is a $C_{1-8}$ alkyl group or a $C_{1-8}$ alkoxy group; each of $l^1$ and $l^2$ which are independent of each other, is 0 or 1; each of $R^9$ to $R^{14}$ is a hydrogen atom or a $C_{1-8}$ alkyl group, or $R^9$ and $R^{10}$, $R^{11}$, and $R^{12}$, or $R^{13}$ and $R^{14}$, are bonded to each other to form a linking group of formula (IV):

(IV)

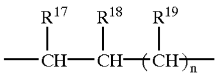

where each of $R^{17}$ to $R^{19}$ is a hydrogen atom or a $C_{1-6}$ alkyl group, and n is 0 or 1; $Z^3$ is a halogen atom or a hydrogen atom; and $X^-$ is a counter anion.

18. The method of claim 17, wherein the counter ion $X^-$ is selected from the group consisting of $Cl^-$, $Br^-$, $I^-$, $ClO_4^-$, $BF_4^-$, $PF_6^-$, benzenesulfonic acid anion, p-toluenesulfonic acid anion, naphthalene-1-sulfonic acid anion and acetic acid anion.

19. The method of claim 1, wherein the high molecular compound (b) comprises a polymer or a resin.

20. The method of claim 1, wherein the high molecular compound (b) comprises a novolak resin, a polyvinyl phenol resin or a mixture thereof.

21. The method of claim 1, wherein the high molecular compound (b) is a novolak resin.

22. The method of claim 1, wherein said composition is in the absence of a compound susceptible to a photochemical sensitizing effect by the photo-thermal conversion material.

23. The method of claim 5, wherein said solubility-suppressing agent (c) is a compound not susceptible to a photochemical sensitizing effect by the light source used to effect photo-thermal conversion material.

24. The method of claim 5, wherein the solubility-suppressing agent (c) lowers the dissolution rate of the blend of component (a) and component (b) to a level of up to 80%.

25. The method of claim 5, wherein the solubility-suppressing agent (c) lowers the dissolution rate of the blend of component (a) and component (b) to a level of up to 50%.

26. The method of claim 5, wherein the solubility-suppressing agent (c) lowers the dissolution rate of the blend of component (a) and component (b) to a level of up to 30%.

27. The method of claim 8, wherein the photo-thermal conversion material (a) is a light-absorbing dye having an absorption band, covering a part or the whole, of a wavelength in a region of from 650 to 1100 nm.

28. The method of claim 8, wherein the photo-thermal conversion material (a) is at least one compound selected from the group consisting of a cyanine dye, a polymethine dye, a squarilium dye, a croconium dye, a pyrylium dye and a thiopyrylium dye.

29. The method of claim 8, wherein the photo-thermal conversion material (a) is at least one compound selected from the group consisting of a cyanine dye of formula (I), (I)

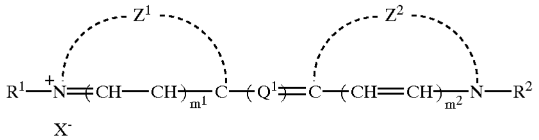

wherein each of $R^1$ and $R^2$ is a $C_{1-8}$ alkyl group which may have a substituent, wherein the substitutent is a phenyl group, a phenoxy group, an alkoxy group, a sulfonic acid group, or a carboxyl group; $Q^1$ is a heptamethine group which may have a substitutent, wherein the substituent is a $C_{1-8}$ alkyl group, a halogen atom or an amino group, or the heptamethine group may contain a cyclohexene ring or a cyclopentene ring having a substituent, formed by mutual bonding of substituents on two methine carbon atoms of the heptamethine group, wherein the substituent is a $C_{1-6}$ alkyl group or a halogen atom; each of $m^1$ and $m^2$ is 0 or 1; each of $Z^1$ and $Z^2$ is a group of atoms required for forming a nitrogen-containing heterocyclic ring; and $X^-$ is a counter anion;

a polymethine dye of formula (II), (II)

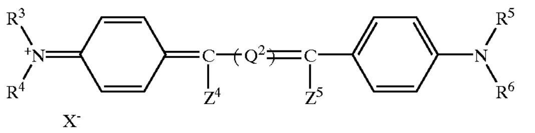

wherein each of $R^3$ to $R^6$ is a $C_{1-8}$ alkyl group; each of $Z^4$ and $Z^5$ is an aryl group which may have a substituent, wherein the aryl group is a phenyl group, a naphthyl group, a furyl group or a thienyl group, and the substituent is a $C_{1-4}$ alkyl group, a $C_{1-8}$ dialkylamino group, a $C_{1-8}$ alkoxy group and a halogen atom; $Q^2$ is a trimethine group or a pentamethine group; and $X^-$ is a counter anion; and a pyrylium or thiopyrylium dye of formula (III)

(III)

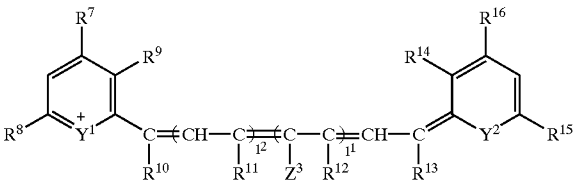

wherein each of $Y^1$ and $Y^2$ is an oxygen atom or a sulfur atom, each of $R^7$, $R^8$, $R^{15}$ and $R^{16}$ is a phenyl group or a naphthyl group which may have a substituent, wherein the substituent is a $C_{1-8}$ alkyl group or a $C_{1-8}$ alkoxy group; each of $l^1$ and $l^2$ which are independent of each other, is 0 or 1; each of $R^9$ to $R^{14}$ is a hydrogen atom or a $C_{1-8}$ alkyl group, or $R^9$ and $R^{10}$, $R^{11}$, and $R^{12}$, or $R^{13}$ and $R^{14}$, are bonded to each other to form a linking group of formula (IV):

(IV)

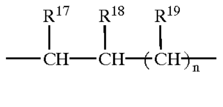

where each of $R^{17}$ to $R^{19}$ is a hydrogen atom or a $C_{1-6}$ alkyl group, and n is 0 or 1; $Z^3$ is a halogen atom or a hydrogen atom; and $X^-$ is a counter anion.

30. The method of claim 29, wherein the counter ion $X^-$ is selected from the group consisting of $Cl^-$, $Br^-$, $I^-$, $ClO_4^-$, $BF_4^-$, $PF_6^-$, benzenesulfonic acid anion, p-toluenesulfonic acid anion, naphthalene-1-sulfonic acid anion and acetic acid anion.

31. The method of claim 8, wherein the high molecular compound comprises a polymer or a resin.

32. The method of claim 8, wherein the high molecular compound comprises a novolak resin, a polyvinyl phenol resin or a mixture thereof.

33. The method of claim 8, wherein the high molecular compound is a novolak resin.

34. The method of claim 8, wherein said composition is in the absence of a compound susceptible to a photochemical sensitizing effect by the photo-thermal conversion material.

35. The method of claim 12, wherein said solubility-suppressing agent (c) is a compound not susceptible to a photochemical sensitizing effect by the light source used to effect photo-thermal conversion.

36. The method of claim 12, wherein the solubility-suppressing agent (c) lowers the dissolution rate of the blend of component (a) and component (b) to a level of up to 80%.

37. The method of claim 12, wherein the solubility-suppressing agent (c) lowers the dissolution rate of the blend of component (a) and component (b) to a level of up to 50%.

38. The method of claim 12, wherein the solubility-suppressing agent (c) lowers the dissolution rate of the blend of component (a) and component (b) to a level of up to 30%.

39. The method of claim 1 wherein the positive photosensitive composition contains no photo-acid generator.

40. The method of claim 8 wherein the positive photosensitive composition contains no photo-acid generator.

* * * * *